US008860706B2

(12) United States Patent
Sakamoto et al.

(10) Patent No.: US 8,860,706 B2
(45) Date of Patent: Oct. 14, 2014

(54) DISPLAY DEVICE

(75) Inventors: Mayuko Sakamoto, Osaka (JP);
Yasuaki Iwase, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 236 days.

(21) Appl. No.: 13/522,025

(22) PCT Filed: Nov. 8, 2010

(86) PCT No.: PCT/JP2010/069816
§ 371 (c)(1),
(2), (4) Date: Jul. 13, 2012

(87) PCT Pub. No.: WO2011/104945
PCT Pub. Date: Sep. 1, 2011

(65) Prior Publication Data
US 2012/0327057 A1  Dec. 27, 2012

(30) Foreign Application Priority Data

Feb. 25, 2010  (JP) ................... 2010-040131

(51) Int. Cl.
*G09G 5/00* (2006.01)
*G11C 19/18* (2006.01)
*G11C 19/28* (2006.01)
*G02F 1/1345* (2006.01)
*G09G 3/36* (2006.01)

(52) U.S. Cl.
CPC .............. *G11C 19/28* (2013.01); *G11C 19/184* (2013.01); *G02F 1/13454* (2013.01); *G09G 2300/0426* (2013.01); *G09G 3/3677* (2013.01)
USPC ........... 345/211; 345/204; 345/207; 345/209; 345/212; 345/214

(58) Field of Classification Search
CPC .................... G09G 3/3677; G09G 2300/0426; G09G 2310/0286; G09G 2330/025; G09G 2330/021
USPC .............. 345/75.2–103, 204–215; 315/169.3; 348/442, 792; 257/59
See application file for complete search history.

(56) References Cited

U.S. PATENT DOCUMENTS 3,904,817 A * 9/1975 Hoffman et al. ............... 348/442
3,982,240 A * 9/1976 Waehner ....................... 341/127
(Continued)

FOREIGN PATENT DOCUMENTS

JP   11-202295 A    7/1999
JP   2002-350809 A  12/2002
(Continued)

OTHER PUBLICATIONS

Official Communication issued in International Patent Application No. PCT/JP2010/069816, mailed on Dec. 14, 2010.

*Primary Examiner* — Prabodh M Dharia
(74) *Attorney, Agent, or Firm* — Keating & Bennett, LLP

(57) ABSTRACT

A display device includes a monolithic gate driver with drive signal trunk wiring lines that transmit drive signals (such as clock signals) made of a source metal in a region on the opposite side of a display region with respect to a shift register region. A VSS trunk wiring line arranged to transmit a low-level direct-current power supply potential is made of a source metal in a region between the shift register region and the display region. Each of bistable circuits defining a shift register and a drive signal trunk wiring line are connected by a drive signal branch wiring line made of a gate metal. Each bistable circuit and the VSS trunk wiring line are connected by a VSS branch wiring line made of a source metal.

9 Claims, 20 Drawing Sheets

(56) References Cited

U.S. PATENT DOCUMENTS

| | | | |
|---|---|---|---|
| 4,536,706 A * | 8/1985 | Kemper | 324/117 R |
| 4,675,575 A * | 6/1987 | Smith et al. | 315/185 S |
| 4,675,874 A * | 6/1987 | POhler et al. | 372/33 |
| 6,320,567 B1 * | 11/2001 | Hirakata et al. | 345/100 |
| 2003/0012330 A1 | 1/2003 | Osame | |
| 2003/0151582 A1 * | 8/2003 | Ishii | 345/100 |
| 2003/0189542 A1 | 10/2003 | Lee et al. | |
| 2003/0222311 A1 | 12/2003 | Kim | |
| 2004/0085280 A1 * | 5/2004 | Kim | 345/97 |
| 2005/0012706 A1 * | 1/2005 | Murade | 345/99 |
| 2006/0056267 A1 | 3/2006 | Kim et al. | |
| 2007/0285383 A1 * | 12/2007 | Iizuka | 345/103 |
| 2008/0067511 A1 | 3/2008 | Kim | |
| 2008/0122389 A1 * | 5/2008 | Hayashi | 315/313 |
| 2008/0266210 A1 | 10/2008 | Nonaka | |
| 2010/0097366 A1 * | 4/2010 | Kitayama et al. | 345/213 |
| 2011/0199354 A1 * | 8/2011 | Iwase et al. | 345/208 |

FOREIGN PATENT DOCUMENTS

| | | |
|---|---|---|
| JP | 2003-141893 A | 5/2003 |
| JP | 2004-054230 A | 2/2004 |
| JP | 2005-522734 A | 7/2005 |
| JP | 2005-527856 A | 9/2005 |
| JP | 2006-079041 A | 3/2006 |
| JP | 2007-316642 A | 12/2007 |
| JP | 2008-292995 A | 12/2008 |

* cited by examiner

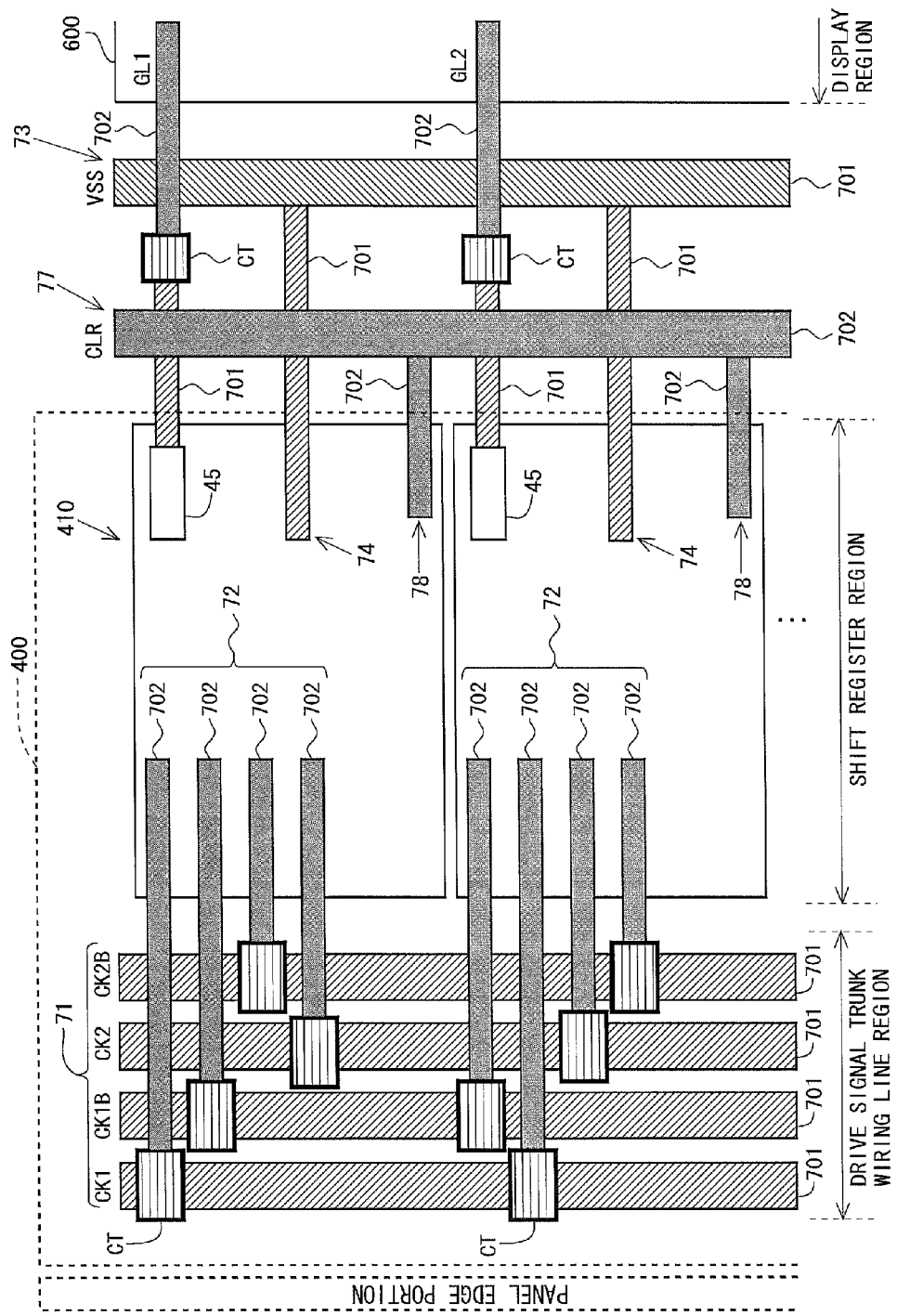

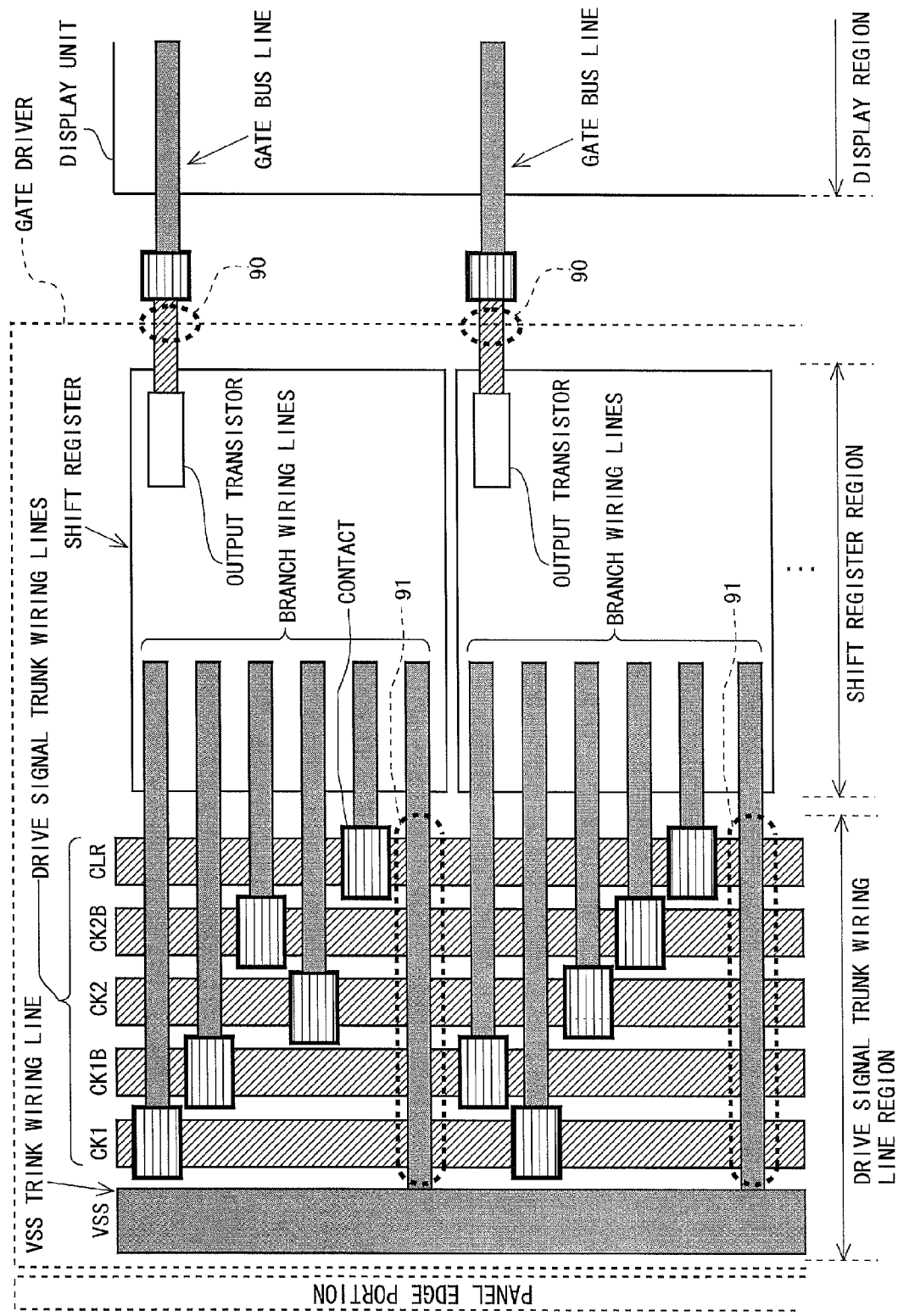

DISPLAY DEVICE

TECHNICAL FIELD

The present invention relates to an active matrix-type display device, and relates, more specifically, to a layout of a scanning signal line drive circuit and an area in the vicinity thereof in a display device.

BACKGROUND ART

Conventionally, in a liquid crystal display device adopting an a-SiTFT liquid crystal panel (a liquid crystal panel using amorphous silicon for semiconductor layers of thin film transistors), since the mobility of amorphous silicon is relatively small, a gate driver for driving gate bus lines (scanning signal lines) is mounted in an area around a substrate composing a panel, as an IC (Integrated Circuit) chip. However, in recent years, in order to achieve miniaturization, a reduction in cost, etc., of the device, formation of a gate driver directly on a substrate has been done. Such a gate driver is called a monolithic gate driver, etc. A panel including a monolithic gate driver is called a gate driver monolithic panel, etc.

FIG. 21 is a diagram showing an exemplary layout of a gate driver (monolithic gate driver) in a conventional liquid crystal display device adopting a gate driver monolithic panel. As shown in FIG. 21, the gate driver includes a shift register configured by a plurality of stages for sequentially driving a plurality of gate bus lines (scanning signal lines) arranged in a display unit; and wiring lines that transmit clock signals, etc., for allowing the shift register to operate. Each stage of the shift register is a bistable circuit which is in either one of two states (a first state and a second state) at each time point and outputs a signal indicating the state (state signal) as a scanning signal through an output transistor (a transistor connected at its one conduction terminal to a scanning signal output terminal and controlling the potential of the state signal by changing the potential at a control terminal of the transistor). Note that FIG. 21 only shows a layout of two stages of the shift register. For wiring lines, there are formed, on a substrate, drive signal trunk wiring lines that transmit clock signals CK1, CK1B, CK2, and CK2B and a clear signal CLR for initializing the state of each bistable circuit; a VSS trunk wiring line that transmits a low-level direct-current power supply potential VSS; and branch wiring lines that connect the drive signal trunk wiring lines and the VSS trunk wiring line to each bistable circuit. Note that in the following a region where the shift register is formed is referred to as a shift register region, a region where trunk wiring lines for the drive signal and VSS are formed is referred to as a trunk wiring line region, and a region corresponding to the display unit is referred to as a display region.

Meanwhile, in general, when a circuit is formed, a circuit portion is arranged to be adjacent to an input portion, and an output portion is arranged to be adjacent to the circuit portion. In the conventional monolithic gate driver, too, as shown in FIG. 21, the trunk wiring line region corresponding to the input portion is provided to be adjacent to the shift register region, and portions corresponding to the output portions and indicated by reference character 90 are also provided to be adjacent to the shift register region. Such an arrangement is common and the trunk wiring lines for various signals are collectively formed in the above-described trunk wiring line region. In the configuration shown in FIG. 21, taking a look at a specific arrangement of each wiring line, the drive signal trunk wiring lines and the VSS trunk wiring line are formed in a region on the opposite side of the display region with respect to the shift register region. Taking a look at a positional relationship between the drive signal trunk wiring lines and the VSS trunk wiring line, the region where the VSS trunk wiring line is formed is closer to a panel edge portion than the region where the drive signal trunk wiring lines are formed. In addition, in the example shown in FIG. 21, the VSS trunk wiring line and the branch wiring lines are formed in the same layer, and the drive signal trunk wiring lines and the branch wiring lines are formed in different layers. Hence, a drive signal trunk wiring line and a branch wiring line are connected to each other through a contact.

Note that in connection with an invention of this matter, the following prior art documents are known. Japanese Patent Application Laid-Open No. 2006-79041, Japanese Patent Application Laid-Open No. 2007-316642, and Published Japanese Translation of PCT Application No. 2005-527856 disclose examples of a layout of two stages of a shift register in a gate driver. In particular, FIG. 2 of Japanese Patent Application Laid-Open No. 2006-79041 and FIG. 6 of Published Japanese Translation of PCT Application No. 2005-527856 disclose examples of a layout where trunk wiring lines are configured such that the widths thereof become narrower as they approach a shift register region from a panel edge portion.

PRIOR ART DOCUMENT(S)

Patent Document(s)

[Patent Document 1] Japanese Patent Application Laid-Open No. 2006-79041

[Patent Document 2] Japanese Patent Application Laid-Open No. 2007-316642

[Patent Document 3] Published Japanese Translation of PCT Application No. 2005-527856

SUMMARY OF THE INVENTION

Problems to be Solved by the Invention

However, according to the conventional configuration, there is an overlapping portion between a branch wiring line for providing a direct-current power supply potential VSS to a bistable circuit from the VSS trunk wiring line and the drive signal trunk wiring lines, like a portion indicated by reference character 91 in FIG. 21. Since the overlapping portion becomes a load capacitance, phenomena such as those shown below may occur. First, although a VSS potential which is a constant potential should be essentially provided to a bistable circuit from the VSS trunk wiring line, the VSS potential changes due to changes in the waveforms of clock signals. In addition, due to the load capacitance of the overlapping portion, waveform distortion occurs in clock signals, etc., which are transmitted through the drive signal trunk wiring lines. According to the conventional configuration, phenomena such as those described above may occur and thus there is a concern about degradation in display quality. In addition, when the same drive signal trunk wiring lines as those of the configuration shown in FIG. 21 are provided, if a VSS trunk wiring line is arranged between a trunk wiring line for a clear signal CLR and a shift register region, then there is an overlapping portion between a drive signal branch wiring line and the VSS trunk wiring line. Thus, a VSS potential changes due to changes in the waveforms of clock signals. Therefore, as with the configuration shown in FIG. 21, there is a concern about degradation in display quality. In addition, conventionally, there is a strong demand for a reduction in power consumption and miniaturization of a display device.

An object of the present invention is therefore to achieve miniaturization while reducing power consumption, without degrading display quality, in a display device including a monolithic gate driver.

Means for Solving the Problems

A first aspect of the present invention is directed to a display device comprising:

a substrate;

a pixel circuit formed in a display region for displaying an image, the display region being a part of an entire region on the substrate;

a plurality of scanning signal lines formed in the display region and forming a part of the pixel circuit;

a shift register that is formed in a part of the entire region on the substrate other than the display region and that includes a plurality of bistable circuits having a first state and a second state and that sequentially drives the plurality of scanning signal lines by the plurality of bistable circuits sequentially placed in the first state based on a plurality of clock signals, the plurality of bistable circuits being connected in series with each other and provided so as to have a one-to-one correspondence with the plurality of scanning signal lines;

drive signal trunk wiring lines formed in a region on an opposite side of the display region with respect to a shift register region, and transmitting shift register drive signals including the plurality of clock signals, the shift register region being a region where the shift register is formed, and the shift register drive signals being signals for controlling operation of the plurality of bistable circuits;

drive signal branch wiring lines that connect the drive signal trunk wiring lines to each bistable circuit;

a direct-current power supply potential trunk wiring line that transmits a direct-current power supply potential to be provided to the plurality of bistable circuits; and a direct-current power supply potential branch wiring line that connects the direct-current power supply potential trunk wiring line to each bistable circuit, wherein the direct-current power supply potential trunk wiring line is formed in a region between the shift register region and the display region.

According to a second aspect of the present invention, in the first aspect of the present invention, the substrate has a layered structure including a first metal film and a second metal film, the first metal film forming wiring line patterns including source electrodes of thin film transistors provided in the plurality of bistable circuits, and the second metal film forming wiring line patterns including gate electrodes of the thin film transistors, and the direct-current power supply potential trunk wiring line and the direct-current power supply potential branch wiring line are formed from a same metal film, the same metal film being one of the first metal film and the second metal film.

According to a third aspect of the present invention, in the second aspect of the present invention, the direct-current power supply potential trunk wiring line includes a first direct-current power supply potential trunk wiring line that transmits a low-level direct-current power supply potential to be provided to the plurality of bistable circuits.

According to a fourth aspect of the present invention, in the third aspect of the present invention, the first direct-current power supply potential trunk wiring line is formed from the first metal film.

According to a fifth aspect of the present invention, in the third aspect of the present invention, the direct-current power supply potential trunk wiring line further includes a second direct-current power supply potential trunk wiring line that transmits a high-level direct-current power supply potential to be provided to the plurality of bistable circuits.

According to a sixth aspect of the present invention, in the fifth aspect of the present invention, the direct-current power supply potential branch wiring line further includes: a first direct-current power supply potential branch wiring line that connects the first direct-current power supply potential trunk wiring line to each bistable circuit; and a second direct-current power supply potential branch wiring line that connects the second direct-current power supply potential trunk wiring line to each bistable circuit, the first direct-current power supply potential trunk wiring line and the first direct-current power supply potential branch wiring line are formed from a same metal film which is one of the first metal film and the second metal film, the second direct-current power supply potential trunk wiring line and the second direct-current power supply potential branch wiring line are formed from a same metal film which is one of the first metal film and the second metal film, and the first direct-current power supply potential trunk wiring line and the second direct-current power supply potential trunk wiring line are formed from different metal films.

According to a seventh aspect of the present invention, in the second aspect of the present invention, the drive signal trunk wiring lines are formed from the first metal film.

According to an eighth aspect of the present invention, in the first aspect of the present invention, wiring lines that form the direct-current power supply potential trunk wiring line and the drive signal trunk wiring lines are all equal in wiring line width to one another.

According to a ninth aspect of the present invention, in the first aspect of the present invention, a trunk wiring line for transmitting a signal which is one of the shift register drive signals other than the plurality of clock signals and generates five pulses or less during one frame period is formed in a region between the shift register region and the display region.

Effects of the Invention

According to the first aspect of the present invention, a direct-current power supply potential trunk wiring line is formed in a region between a shift register region and a display region, and drive signal trunk wiring lines are formed in a region on the opposite side of the display region with respect to the shift register region. Hence, unlike the conventional configuration, there is no overlapping portion between a direct-current power supply potential branch wiring line for providing a direct-current power supply potential to a bistable circuit from the direct-current power supply potential trunk wiring line and the drive signal trunk wiring lines. Therefore, a load capacitance resulting from such an overlapping portion does not occur, inhibiting a change in direct-current power supply potential resulting from changes in the waveforms of drive signals such as clock signals. By this, the width of the direct-current power supply potential trunk wiring line can be made narrower than that of the conventional configuration. In addition, since a load capacitance resulting from an overlapping portion between a direct-current power supply potential branch wiring line and the drive signal trunk wiring lines does not occur, the occurrence of waveform distortion of drive signals, such as clock signals, which are transmitted through the drive signal trunk wiring lines is inhibited. By this, the width of the drive signal trunk wiring lines can be made narrower than that of the conventional configuration. Furthermore, since a load capacitance is reduced over the conventional configuration, a reduction in power consumption can be achieved. Moreover, since, as described above, the width of the direct-current power supply potential trunk wiring line and the width of the drive signal trunk wiring lines can be made narrower than those of the conventional configuration, the picture-frame of the panel can be narrowed.

According to the second aspect of the present invention, since there is no need of a contact for connecting the direct-current power supply potential trunk wiring line to a direct-current power supply potential branch wiring line, an increase in resistance resulting from the wiring line width becoming narrow at a contact portion is inhibited.

According to the third aspect of the present invention, in a display device including a shift register to which a low-level direct-current power supply potential is provided, the same advantageous effects as those obtained in the first aspect of the present invention and the same advantageous effect as that obtained in the second aspect of the present invention can be obtained.

According to the fourth aspect of the present invention, a trunk wiring line that transmits a low-level direct-current power supply potential is formed from the same metal film as the source electrodes of thin film transistors in bistable circuits composing the shift register. Here, in general, in a bistable circuit, a low-level direct-current power supply potential is provided to the source electrodes of thin film transistors. Due to the above, a low-level direct-current power supply potential can be provided to the source electrodes of thin film transistors in a bistable circuit without providing a contact in the shift register region.

According to the fifth aspect of the present invention, in a display device including a shift register to which a low-level direct-current power supply potential and a high-level direct-current power supply potential are provided, the same advantageous effects as those obtained in the first aspect of the present invention and the same advantageous effect as that obtained in the second aspect of the present invention can be obtained.

According to the sixth aspect of the present invention, in a display device including a shift register to which a low-level direct-current power supply potential and a high-level direct-current power supply potential are provided, since there is no need of a contact for connecting a trunk wiring line to a branch wiring line for both of a low-level direct-current power supply potential wiring line and a high-level direct-current power supply potential wiring line, an increase in resistance resulting from the wiring line width becoming narrow at a contact portion is inhibited.

According to the seventh aspect of the present invention, drive signals such as clock signals can be provided to thin film transistors in a bistable circuit without providing a contact in the shift register region.

According to the eighth aspect of the present invention, in a configuration in which the wiring line width of the direct-current power supply potential trunk wiring line is made equal to the wiring line width of the drive signal trunk wiring lines, the same advantageous effects as those obtained in the first aspect of the present invention can be obtained.

According to the ninth aspect of the present invention, in a configuration in which not only the direct-current power supply potential trunk wiring line but also a trunk wiring line that transmits a signal with a small on-duty is formed in a region between the shift register region and the display region, the same advantageous effects as those obtained in the first aspect of the present invention can be obtained.

BRIEF DESCRIPTION OF THE DRAWINGS

FIG. 20 is a layout diagram of a gate driver and an area in the vicinity thereof in a second variant of the third embodiment.

FIG. 21 is a diagram showing an exemplary layout of a gate driver in a conventional liquid crystal display device adopting a gate driver monolithic panel.

MODES FOR CARRYING OUT THE INVENTION

Embodiments of the present invention will be described below with reference to the accompanying drawings.

<1. First Embodiment>

<1.1 Overall Configuration and Summary of Operation>

Figure 2:
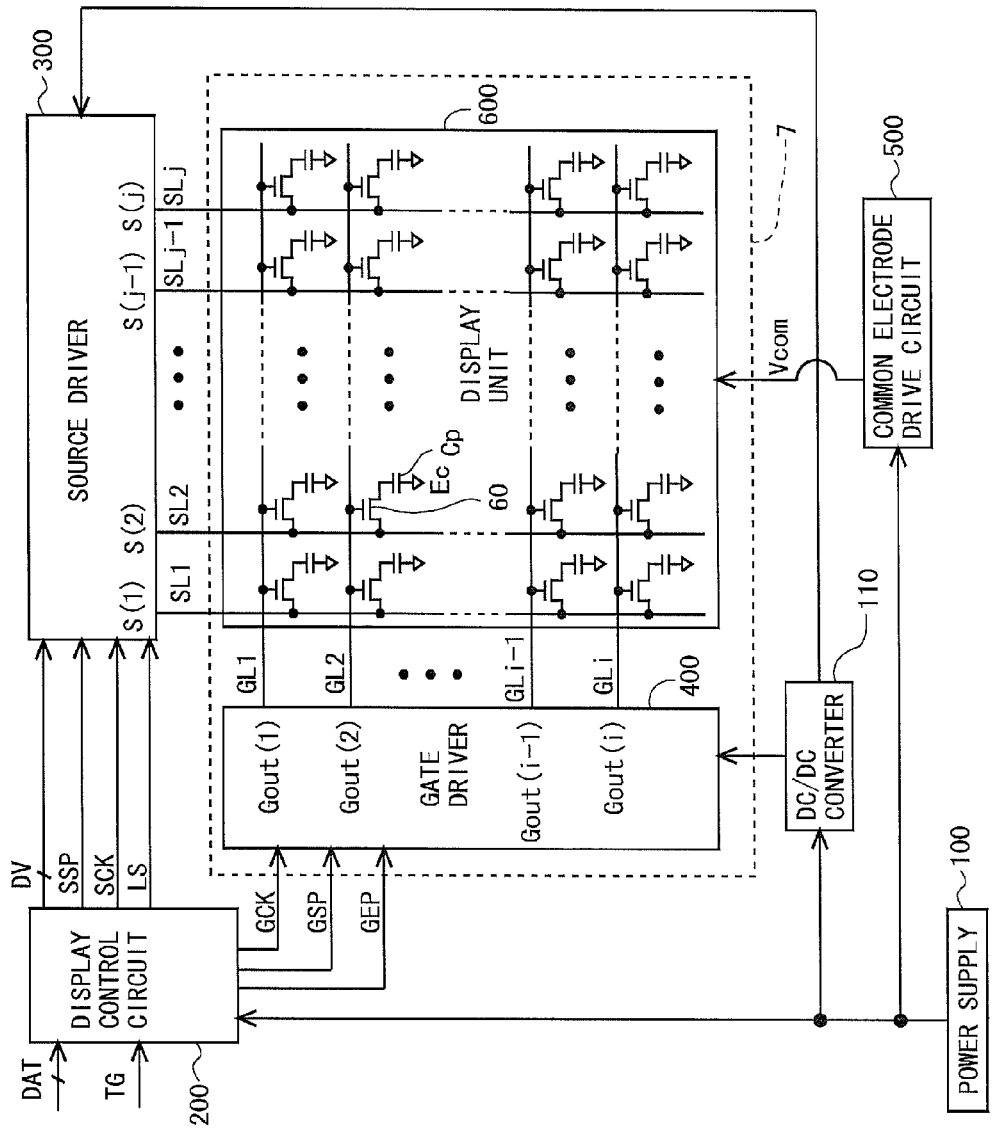
FIG. 2 is a block diagram showing an overall configuration of the liquid crystal display device in the first embodiment.

FIG. 2 is a block diagram showing an overall configuration of an active matrix-type liquid crystal display device according to a first embodiment of the present invention. As shown in FIG. 2, the liquid crystal display device includes a power supply 100, a DC/DC converter 110, a display control circuit 200, a source driver (video signal line drive circuit) 300, a gate driver (scanning signal line drive circuit) 400, a common electrode drive circuit 500, and a display unit 600. Note that in the present embodiment the gate driver 400 and the display unit 600 are formed on the same substrate (an array substrate which is one of two substrates composing a liquid crystal panel) 7. Namely, the gate driver 400 in the present embodiment is a monolithic gate driver.

In the display unit 600 is formed a pixel circuit including a plurality of (j) source bus lines (video signal lines) SL1 to SLj; a plurality of (i) gate bus lines (scanning signal lines) GL1 to GLi; and a plurality of (i×j) pixel formation portions provided at the respective intersections of the source bus lines SL1 to SLj and the gate bus lines GL1 to GLi.

The plurality of pixel formation portions are arranged in a matrix and thereby form a pixel array. Each pixel formation portion is composed of a thin film transistor (TFT) 60 which is a switching element connected at its gate terminal to a gate bus line passing through a corresponding intersection, and connected at its source terminal to a source bus line passing through the intersection; a pixel electrode connected to a drain terminal of the thin film transistor 60; a common electrode Ec which is a counter electrode provided so as to be shared by the plurality of pixel formation portions; and a liquid crystal layer which is provided so as to be shared by the plurality of pixel formation portions and which is sandwiched between the pixel electrode and the common electrode Ec. By a liquid crystal capacitance formed by the pixel electrode and the common electrode Ec, a pixel capacitance Cp is formed. Note that although normally an auxiliary capacitance is provided in parallel with the liquid crystal capacitance in order to securely hold a voltage in the pixel capacitance Cp, the auxiliary capacitance is not directly related to the present invention and thus the description and depiction thereof are omitted.

The power supply 100 supplies a predetermined power supply voltage to the DC/DC converter 110, the display control circuit 200, and the common electrode drive circuit 500. The DC/DC converter 110 generates, from the power supply voltage, predetermined direct-current voltages for allowing the source driver 300 and the gate driver 400 to operate and supplies the predetermined direct-current voltages to the source driver 300 and the gate driver 400. The common electrode drive circuit 500 provides a predetermined potential Vcom to the common electrode Ec.

The display control circuit 200 receives an image signal DAT and a timing signal group TG, such as a horizontal synchronizing signal and a vertical synchronizing signal, which are sent from an external source and outputs a digital video signal DV and a source start pulse signal SSP, a source clock signal SCK, a latch strobe signal LS, a gate start pulse signal GSP, a gate end pulse signal GEP, and a gate clock signal GCK which are signals for controlling image display on the display unit 600. Note that in the present embodiment the gate clock signal GCK is configured by 4-phase clock signals CK1 (hereinafter, referred to as a first gate clock signal), CK1B (hereinafter, referred to as a second gate clock signal), CK2 (hereinafter, referred to as a third gate clock signal), and CK2B (hereinafter, referred to as a fourth gate clock signal).

The source driver 300 receives the digital video signal DV, the source start pulse signal SSP, the source clock signal SCK, and the latch strobe signal LS which are outputted from the display control circuit 200, and applies driving video signals S(1) to S(j) to the source bus lines SL1 to SLj, respectively.

The gate driver 400 repeats application of active scanning signals Gout(1) to Gout(i) to the respective gate bus lines GL1 to GLi in cycles of one vertical scanning period, based on the gate start pulse signal GSP, the gate end pulse signal GEP, and the gate clock signal GCK which are outputted from the display control circuit 200. Note that a detailed description of the gate driver 400 will be made later.

In the above-described manner, the driving video signals S(1) to S(j) are applied to the source bus lines SL1 to SLj, respectively, and the scanning signals Gout(1) to Gout(i) are applied to the gate bus lines GL1 to GLi, respectively, whereby an image based on the image signal DAT which is sent from the external source is displayed on the display unit 600.

<1.2 Structure of the Array Substrate>

Figure 3:
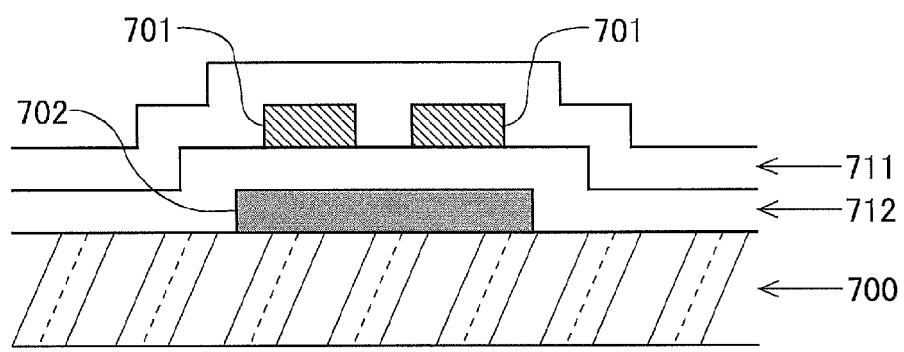
FIG. 3 is a partial cross-sectional view of an array substrate in the first embodiment.

FIG. 3 is a partial cross-sectional view of the array substrate 7. The array substrate 7 has a layered structure so that the gate driver 400, the pixel circuit, etc., can be formed, and the layered structure includes two metal films (metal layers). Specifically, as shown in FIG. 3, a metal film 702, a protective film 712, a metal film 701, and a protective film 711 are stacked on top of one another on a glass substrate 700. The metal film 701 is used to form source electrodes (and drain electrodes) of thin film transistors which are provided in the gate driver 400 and in the pixel circuit. Hence, such a metal film 701 is hereinafter referred to as a source metal 701. The metal film 702 is used to form gate electrodes of the thin film transistors. Hence, such a metal film 702 is hereinafter referred to as a gate metal 702. Note that the source metal 701 and the gate metal 702 are not only used as the electrodes of the thin film transistors, but also used as wiring line patterns formed in the gate driver 400 or in the pixel circuit. In addition, in the present embodiment, a first metal film is implemented by the source metal 701 and a second metal film is implemented by the gate metal 702.

<1.3 Gate Driver>

<1.3.1 Configuration and Operation of the Gate Driver>

Figure 4:
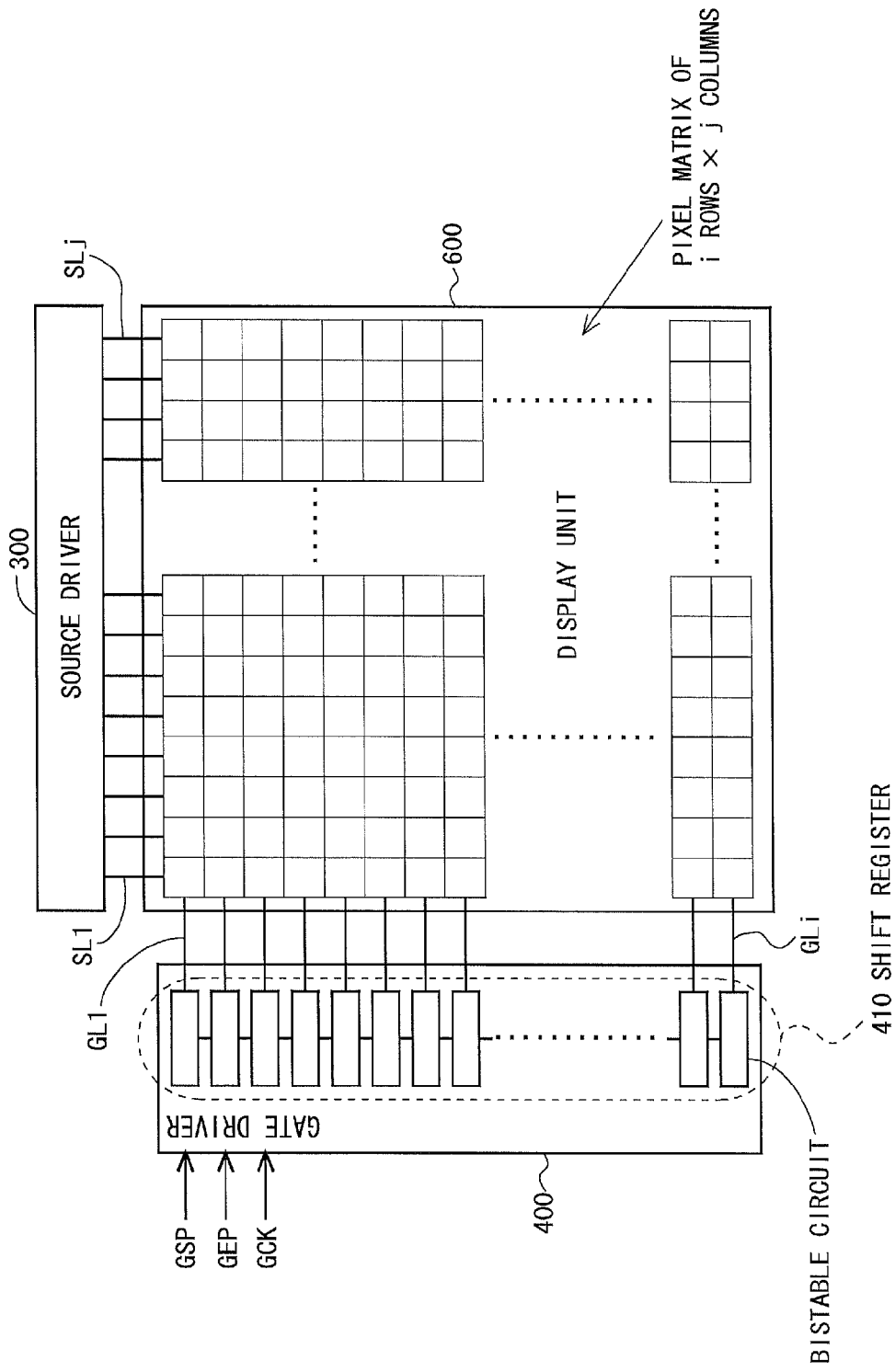
FIG. 4 is a block diagram for describing a configuration of the gate driver in the first embodiment.

Next, a configuration of the gate driver 400 in the present embodiment will be described. As shown in FIG. 4, the gate driver 400 is composed of a shift register 410 configured by a plurality of stages. A pixel matrix of i rows×j columns is formed in the display unit 600, and the stages of the shift register 410 are provided so as to have a one-to-one correspondence with the rows of the pixel matrix. In addition, each stage of the shift register 410 is a bistable circuit which is in either one of two states (a first state and a second state) at each time point and outputs a signal indicating the state (hereinafter, referred to as a state signal). As such, the shift register 410 is configured by i bistable circuits. Note that a layout of the gate driver 400 will be described later.

Figure 5:
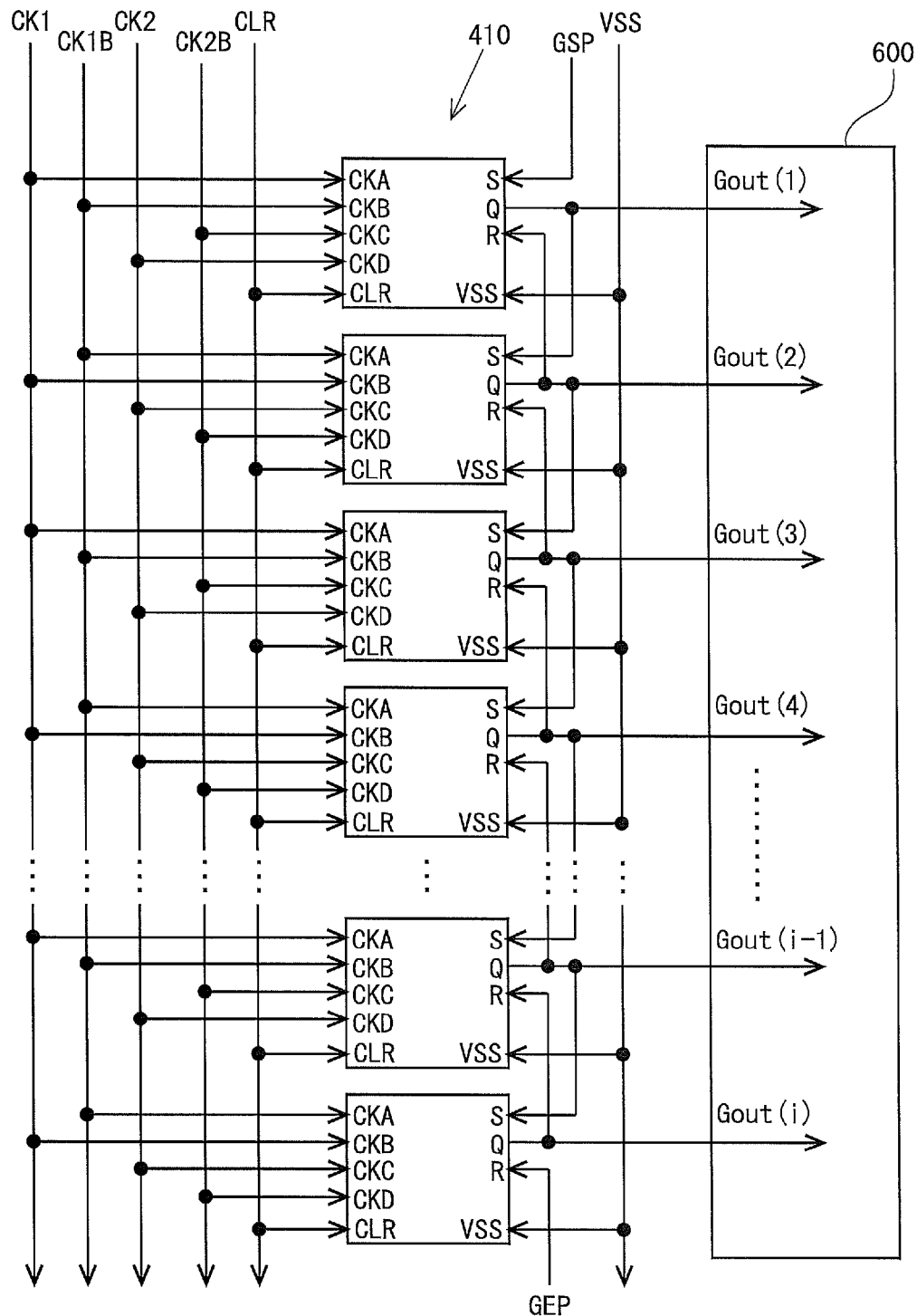
FIG. 5 is a block diagram showing a configuration of a shift register in the gate driver in the first embodiment.

FIG. 5 is a block diagram showing a configuration of the shift register 410 in the gate driver 400. As described above, the shift register 410 is configured by i bistable circuits. Each bistable circuit is provided with input terminals for receiving 4-phase clock signals CKA (hereinafter, referred to as a first clock), CKB (hereinafter, referred to as a second clock), CKC (hereinafter, referred to as a third clock), and CKD (hereinafter, referred to as a fourth clock); an input terminal for receiving a set signal S; an input terminal for receiving a reset signal R; an input terminal for receiving a clear signal CLR;

an input terminal for receiving a low-level direct-current power supply potential VSS; and an output terminal for outputting a state signal Q.

Signals to be provided to the input terminals of each stage (each bistable circuit) of the shift register 410 are as follows. For the first stage, a first gate clock signal CK1 is provided as a first clock CKA, a second gate clock signal CK1B is provided as a second clock CKB, a fourth gate clock signal CK2B is provided as a third clock CKC, and a third gate clock signal CK2 is provided as a fourth clock CKD. For the second stage, the second gate clock signal CK1B is provided as a first clock CKA, the first gate clock signal CK1 is provided as a second clock CKB, the third gate clock signal CK2 is provided as a third clock CKC, and the fourth gate clock signal CK2B is provided as a fourth clock CKD. For the third and subsequent stages, the same configuration as that ranging from the above-described first to second stage is repeated every two stages. In addition, for the first stage, a gate start pulse signal GSP is provided as a set signal S. For the second and subsequent stages, a state signal Q outputted from a previous stage is provided as a set signal S. Furthermore, a gate end pulse signal GEP is provided to an ith stage as a reset signal R. For the first to (i−1)th stages, a state signal Q outputted from a subsequent stage is provided as a reset signal R. Note that a low-level direct-current power supply potential VSS and a clear signal CLR are provided to all of the stages in a sharing manner.

Next, with reference to FIGS. 5 to 7, the operation of the gate driver 400 in the present embodiment will be described. To the shift register 410 are provided 4-phase clock signals (a first gate clock signal CK1, a second gate clock signal CK1B, a third gate clock signal CK2, and a fourth gate clock signal CK2B), a gate start pulse signal GSP, a gate end pulse signal GEP, a low-level direct-current power supply potential VSS, and a clear signal CLR.

Figure 6:
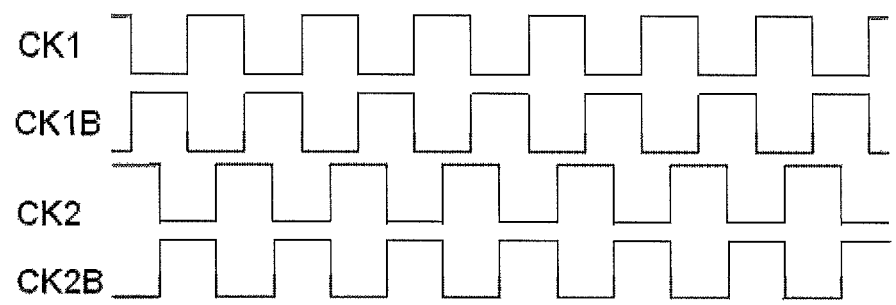
FIG. 6 is a signal waveform diagram for describing the operation of the gate driver in the first embodiment.
Figure 7:
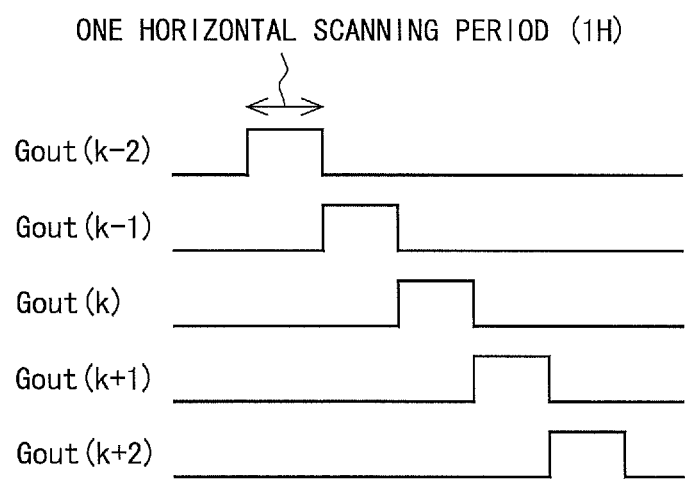
FIG. 7 is a signal waveform diagram for describing the operation of the gate driver in the first embodiment.

As shown in FIG. 6, the first gate clock signal CK1 and the second gate clock signal CK1B are shifted in phase by 180 degrees (a period corresponding to one horizontal scanning period) and the third gate clock signal CK2 and the fourth gate clock signal CK2B are shifted in phase by 180 degrees. The third gate clock signal CK2 is delayed in phase by 90 degrees from the first gate clock signal CK1. The first to fourth gate clock signals CK1, CKB1, CK2, and CK2B are all placed in a high level (H level) state at intervals of one horizontal scanning period.

When a gate start pulse signal GSP serving as a set signal S is provided to the first stage of the shift register 410, a pulse included in the gate start pulse signal GSP (this pulse is included in a state signal Q outputted from each stage) is sequentially transferred from the first to the ith stage, based on the first to fourth gate clock signals CK1, CKB1, CK2, and CK2B. Then, according to the transfer of the pulse, state signals Q outputted from the respective stages of the shift register 410 sequentially go to a high level. Then, the state signals Q outputted from the respective stages are provided to the gate bus lines GL1 to GLi, respectively, as scanning signals Gout (1) to Gout (i). By this, as shown in FIG. 7, scanning signals which sequentially go to a high level every horizontal scanning period are provided to the gate bus lines in the display unit 600.

<1.3.2 Configuration and Operation of the Bistable Circuits>

Figure 8:
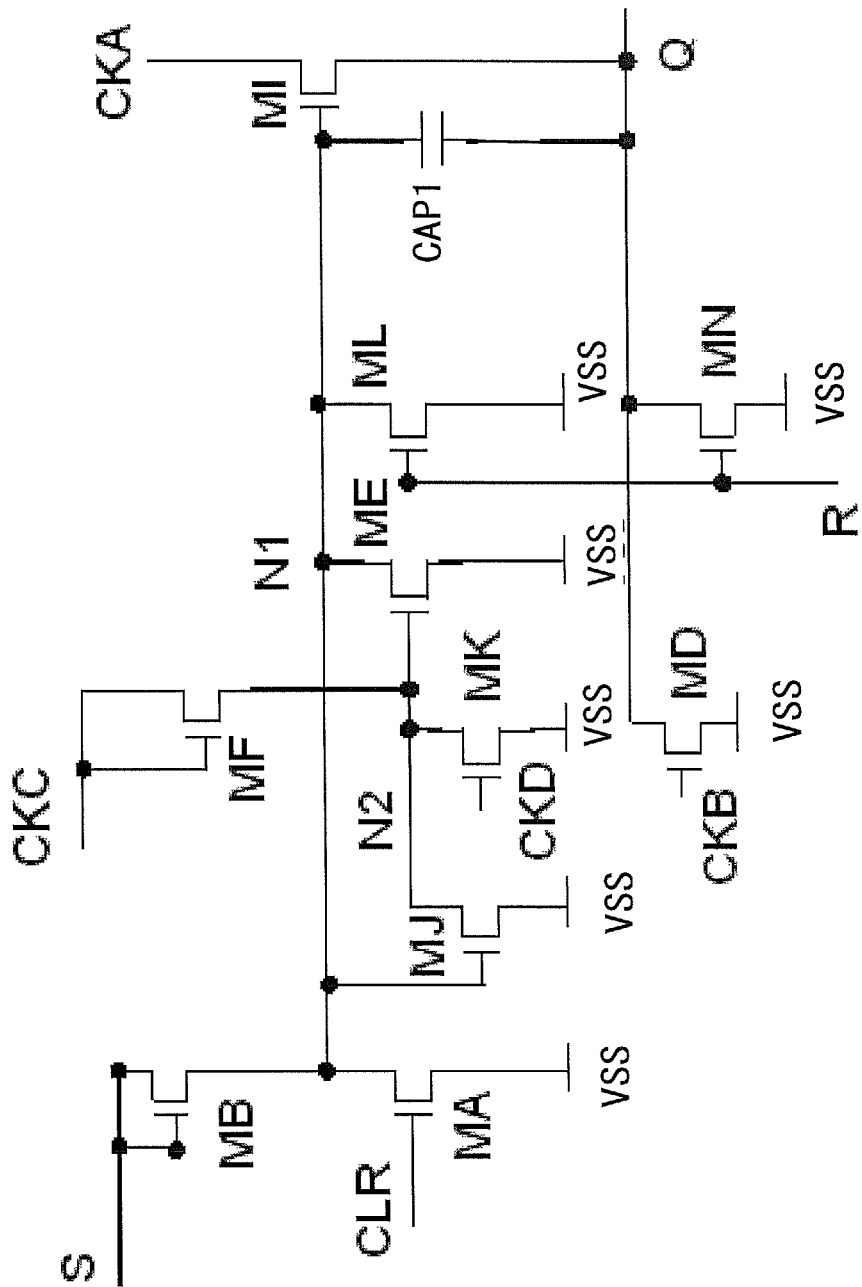
FIG. 8 is a circuit diagram showing an exemplary configuration of one stage (bistable circuit) of the shift register in the first embodiment.

FIG. 8 is a circuit diagram showing a configuration of a bistable circuit included in the shift register 410 (a configuration of one stage of the shift register 410). As shown in FIG. 8, the bistable circuit includes 10 thin film transistors MA, MB, MI, MF, MJ, MK, ME, ML, MN, and MD and a capacitor CAP1. In addition, the bistable circuit includes an input terminal that receives a first clock CKA; an input terminal that receives a second clock CKB; an input terminal that receives a third clock CKC; an input terminal that receives a fourth clock CKD; an input terminal that receives a set signal S; an input terminal that receives a reset signal R; an input terminal that receives a clear signal CLR; and an output terminal that outputs a state signal Q. Note that semiconductor layers of the above-described thin film transistors are formed on the substrate using amorphous silicon, microcrystalline silicon, metal oxide (e.g., an oxide containing Zn, an oxide containing In, and an oxide containing Ga), etc.

The source terminal of the thin film transistor MB, the drain terminal of the thin film transistor MA, the gate terminal of the thin film transistor MJ, the drain terminal of the thin film transistor ME, the drain terminal of the thin film transistor ML, the gate terminal of the thin film transistor MI, and one end of the capacitor CAP1 are connected to one another. Note that a region (wiring line) where they are connected to one another is referred to as a first node for convenience s sake and is given reference character N1.

The drain terminal of the thin film transistor MJ, the drain terminal of the thin film transistor MK, the source terminal of the thin film transistor MF, and the gate terminal of the thin film transistor ME are connected to one another. Note that a region (wiring line) where they are connected to one another is referred to as a second node for convenience s sake and is given reference character N2.

Next, the functions of the respective components in the bistable circuit will be described. The thin film transistor MA brings the potential of the first node N1 to a low level when the clear signal is at a high level. The thin film transistor MB brings the potential of the first node N1 to a high level when the set signal S is at a high level. The thin film transistor MI provides the potential of the first clock CKA to the output terminal when the potential of the first node N1 is at a high level. The thin film transistor MF brings the potential of the second node N2 to a high level when the third clock CKC is at a high level.

The thin film transistor MJ brings the potential of the second node N2 to a low level when the potential of the first node N1 is at a high level. If, during a period during which a gate bus line connected to the output terminal of the bistable circuit is selected (hereinafter, referred to as a selected period), the second node N2 goes to a high level and thus the thin film transistor ME is placed in an on state, then the potential of the first node N1 decreases and thus the thin film transistor MI is placed in an off state. To prevent such a phenomenon, the thin film transistor MJ is provided.

The thin film transistor MK brings the potential of the second node N2 to a low level when the fourth clock CKD is at a high level. If the thin film transistor MK is not provided, then during a period other than a selected period, the potential of the second node N2 is always at a high level and thus a bias voltage is continuously applied to the thin film transistor ME. This increases the threshold voltage of the thin film transistor ME and accordingly the thin film transistor ME does not sufficiently function as a switch. To prevent such a phenomenon, the thin film transistor MK is provided.

The thin film transistor ME brings the potential of the first node N1 to a low level when the potential of the second node N2 is at a high level. The thin film transistor ML brings the potential of the first node N1 to a low level when the reset signal R is at a high level. The thin film transistor MN brings the potential of the output terminal to a low level when the reset signal R is at a high level. The thin film transistor MD brings the potential of the output terminal to a low level when the second clock CKB is at a high level. The capacitor CAP1 functions as a compensation capacitance for maintaining the potential of the first node N1 at a high level during a period during which the gate bus line connected to the output terminal of the bistable circuit is selected.

Figure 9:
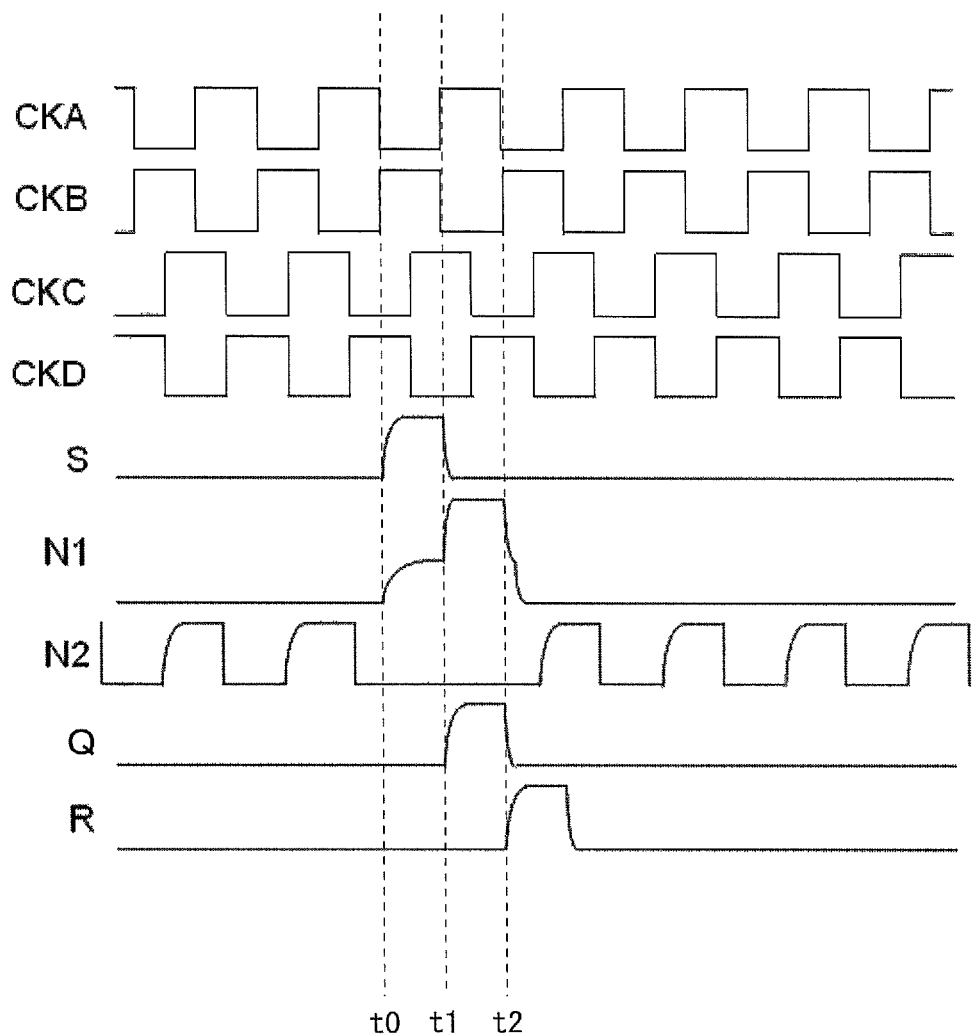
FIG. 9 is a signal waveform diagram for describing the operation of the shift register in the first embodiment.

Next, with reference to FIGS. 8 and 9, the operation of a bistable circuit in the present embodiment will be described. During the operation of the liquid crystal display device, first to fourth clocks CKA to CKD having waveforms such as those shown in FIG. 9 are provided to a bistable circuit. When reaching time point t0, a pulse of a set signal S is provided to the bistable circuit. Since the thin film transistor MB is diode-connected, the first node N1 is precharged by the pulse of the set signal S during the period from t0 to t1. During this period, the thin film transistor MJ is placed in an on state, and thus, the potential of the second node N2 is brought to a low level. In addition, during this period, a reset signal R is at a low level. By the above, the thin film transistor ME and the thin film transistor ML are placed in an off state and thus the potential of the first node N1 increased by the precharge does not decrease during the period from time point t0 to time point t1.

When reaching time point t1, the first clock CKA changes from a low level to a high level. Here, the first clock CKA is provided to the source terminal of the thin film transistor MI, and a parasitic capacitance (not shown) is present between the gate and source of the thin film transistor MI. Hence, according to an increase in the source potential of the thin film transistor MI, the potential of the first node N1 also increases (the first node N1 is boot-strapped). As a result, the thin film transistor MI is placed in an on state. Since the state in which the first clock CKA is brought to a high level is maintained until time point t2, a state signal Q is at a high level during the period from time point t1 to time point t2. By this, a gate bus line connected to the bistable circuit that outputs the high-level state signal Q is placed in a selected state, and thus, writing of video signals to pixel capacitances Cp is performed in pixel formation portions of a row corresponding to the gate bus line. Note that during the period from time point t1 to time point t2, as with the period from time point t0 to time point t1, the thin film transistor ME and the thin film transistor ML are placed in an off state. Hence, during the period from time point t1 to time point t2, the potential of the first node N1 does not decrease.

When reaching time point t2, the first clock CKA changes from a high level to a low level. In addition, the second clock CKB changes from a low level to a high level. Furthermore, the reset signal R changes from a low level to a high level. By this, the thin film transistors MD, ML, and MN are placed in an on state. By the thin film transistor MD and the thin film transistor MN being placed in an on state, the potential of the state signal Q decreases to a low level. In addition, by the thin film transistor ML being placed in an on state, the potential of the first node N1 decreases to a low level.

In the above-described manner, a state signal Q which is maintained at a high level only during one horizontal scanning period (a period substantially corresponding to the period from time point t1 to time point t2) is outputted from each bistable circuit, and the state signal Q is provided to a corresponding gate bus line as a scanning signal Gout.

<1.3.3 Layout of the Gate Driver>

Figure 1:
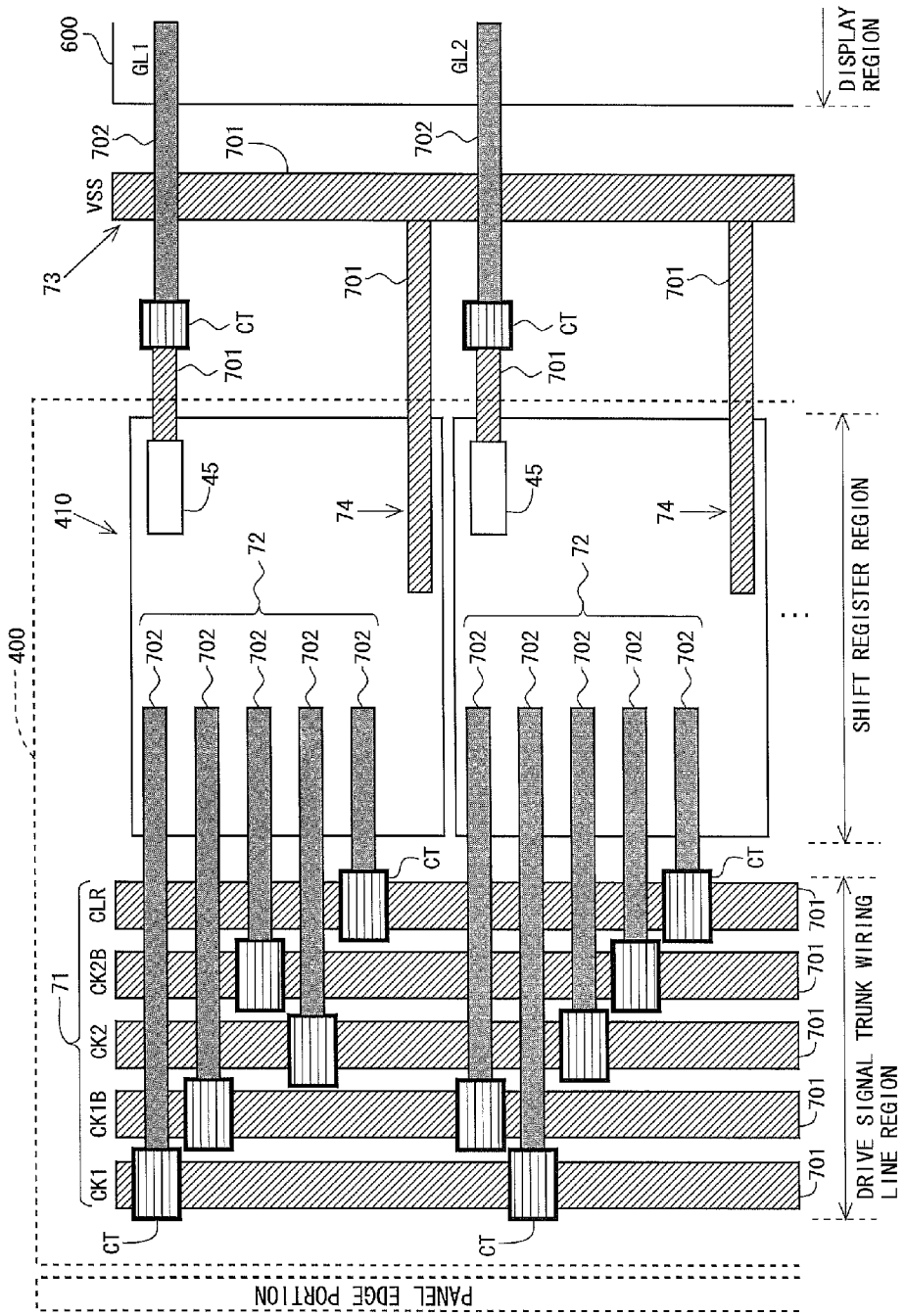
FIG. 1 is a layout diagram of a gate driver and an area in the vicinity thereof in an active matrix-type liquid crystal display device according to a first embodiment of the present invention.

In the present embodiment, the gate driver 400 and an area in the vicinity thereof have a layout such as that shown in FIG. 1. Note that FIG. 1 only shows a layout of two stages of the shift register 410. Drive signal trunk wiring lines 71 that transmit signals (shift register drive signals) for controlling the operation of the bistable circuits, such as a first gate clock signal CK1, a second gate clock signal CK1B, a third gate clock signal CK2, a fourth gate clock signal CK2B, and a clear signal CLR, are formed in a region between a shift register region and a panel edge portion. A VSS trunk wiring line 73 that transmits a low-level direct-current power supply potential VSS is formed in a region between the shift register region and a display region. As described above, the drive signal trunk wiring lines 71, the VSS trunk wiring line 73, and the shift register 410 are formed on the array substrate in a monolithic manner. Note that in the following the region where the drive signal trunk wiring lines 71 are formed is referred to as a drive signal trunk wiring line region.

The drive signal trunk wiring lines 71 are all formed from a source metal 701. Each bistable circuit in the shift register 410 and the drive signal trunk wiring lines 71 are connected to each other by wiring line patterns (hereinafter, referred to as drive signal branch wiring lines) 72 formed from a gate metal 702. Note that a drive signal trunk wiring line 71 and a drive signal branch wiring line 72 are connected to each other through a contact CT. The VSS trunk wiring line 73 is formed from a source metal 701. Each bistable circuit in the shift register 410 and the VSS trunk wiring line 73 are connected to each other by a wiring line pattern (hereinafter, referred to as a VSS branch wiring line) 74 formed from a source metal 701. A gate bus line is configured by a wiring line pattern extending from an output transistor 45 to the display region side and formed from a source metal 701, a wiring line pattern extending from within the display region to the shift register region side and formed from a gate metal 702, and a contact CT that connects the wiring line pattern formed from the source metal 701 to the wiring line pattern formed from the gate metal 702.

As described above, in the present embodiment, as with the conventional configuration (see FIG. 21), the drive signal trunk wiring lines 71 are formed in a region between the shift register region and the panel edge portion. Namely, the drive signal trunk wiring lines 71 are formed in a region on the opposite side of the display region with respect to the shift register region. On the other hand, the VSS trunk wiring line 73 is, unlike the conventional configuration, formed in a region between the shift register region and the display region.

Note that in the present embodiment a first direct-current power supply potential trunk wiring line is implemented by the VSS trunk wiring line 73, and a first direct-current power supply potential branch wiring line is implemented by the VSS branch wiring line 74.

<1.4 Advantageous Effects>

According to the present embodiment, unlike the conventional configuration (see FIG. 21), there is no overlapping portion between a VSS branch wiring line 74 for providing a direct-current power supply potential VSS to a bistable circuit from the VSS trunk wiring line 73 and the drive signal trunk wiring lines 71. Hence, a load capacitance resulting from such an overlapping portion does not occur. Therefore, a change in VSS potential resulting from changes in the waveforms of clock signals (see FIG. 6) is inhibited. By this, the width of the VSS trunk wiring line 73 can be made narrower than that of the conventional configuration. For example, the width of the VSS trunk wiring line 73 can be made equal to the width of the drive signal trunk wiring lines 71 that transmit clock signals, etc. In addition, since a load capacitance resulting from the overlapping portion between the VSS branch wiring line 74 and the drive signal trunk wiring lines 71 does not occur, the occurrence of waveform distortion of clock signals, etc., which are transmitted through the drive signal trunk wiring lines 71 is inhibited. By this, the width of the drive signal trunk wiring lines 71 can be made narrower than that of the conventional configuration. Furthermore, since a load capacitance is reduced over the conventional configuration, a reduction in power consumption can be achieved. Moreover, since, as described above, the width of the VSS trunk wiring line 73 and the width of the drive signal trunk wiring lines 71 can be made narrower than those of the conventional configuration, the picture-frame of the panel can be narrowed. As explained above, in the liquid crystal display device including the monolithic gate driver, without degrading display quality, miniaturization can be achieved while reducing power consumption.

Meanwhile, as is appreciated from FIG. 8, in each bistable circuit in the shift register 410, a low-level direct-current power supply potential VSS is provided to the source terminals of thin film transistors MA, MD, ME, MJ, MK, ML, and MN. In the present embodiment, since the VSS trunk wiring line 73 and each VSS branch wiring line 74 are formed from a source metal 701, a VSS potential can be provided to the source terminals of the thin film transistors MA, MD, ME, MJ, MK, ML, and MN without providing a contact in the shift register region. In addition, as is appreciated from FIG. 8, clock signals are mostly provided to the gate terminals of thin film transistors. In the present embodiment, since branch wiring lines for clock signals (drive signal branch wiring lines 72) are formed from a gate metal 702, clock signals can be provided to the thin film transistors without providing a contact in the shift register region. Note that at this time the trunk wiring lines for clock signals (drive signal trunk wiring lines 71) are formed from a source metal 701.

<1.5 Variants>

Figure 10:
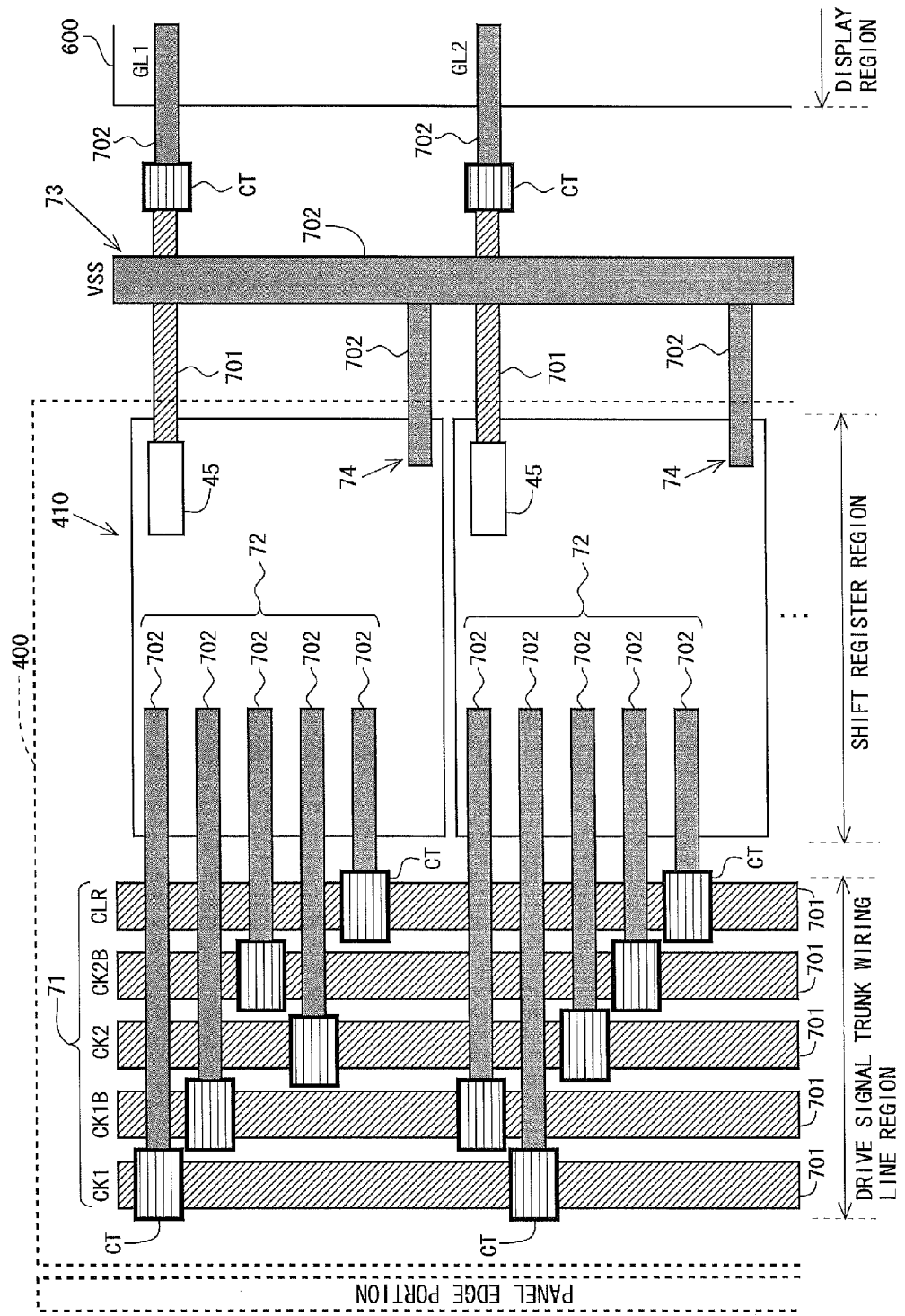
FIG. 10 is a layout diagram of a gate driver and an area in the vicinity thereof in a variant of the first embodiment.

Although in the first embodiment the VSS trunk wiring line 73 and the drive signal trunk wiring lines 71 are formed in the same layer, the present invention is not limited thereto and as shown in FIG. 10, a VSS trunk wiring line 73 and drive signal trunk wiring lines 71 may be formed in different layers. Specifically, in the configuration shown in FIG. 10, the VSS trunk wiring line 73 is formed from a gate metal 702 and the drive signal trunk wiring lines 71 are formed from a source metal 701. Since the VSS trunk wiring line 73 is formed from the gate metal 702, unlike the first embodiment, VSS branch wiring lines 74 are formed from a gate metal 702 and contacts CTs provided to gate bus lines are arranged closer to the display region side than the VSS trunk wiring line 73.

Figure 11:
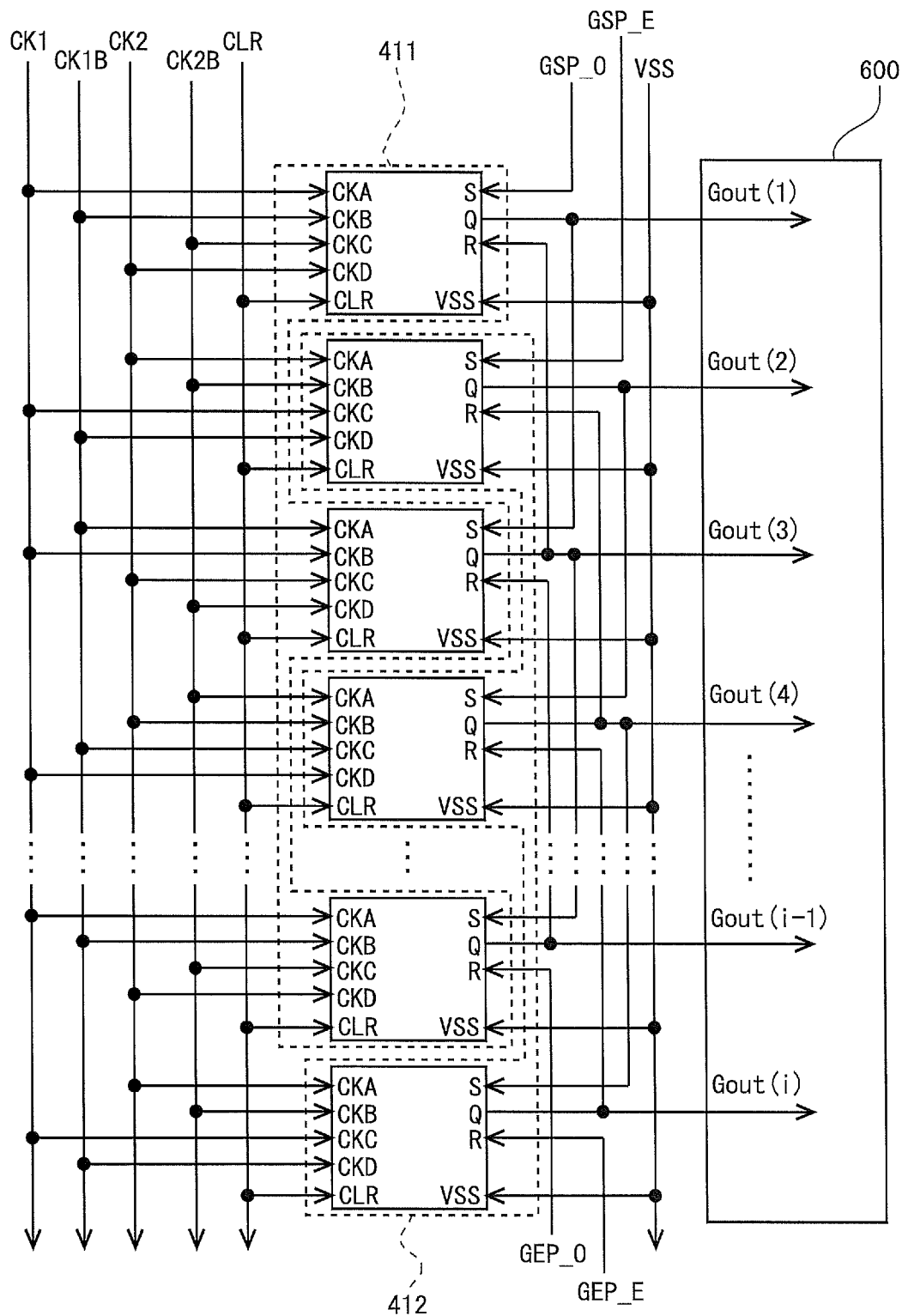
FIG. 11 is a block diagram showing a configuration of a shift register in a gate driver in a variant of the first embodiment.

In addition, although in the first embodiment a single shift register 410 is included in the gate driver 400, the present invention is not limited thereto and a plurality of shift registers may be included in the gate driver 400. For example, as shown in FIG. 11, the configuration may be such that two shift registers (a shift register 411 composed of bistable circuits of odd-numbered stages and a shift register 412 composed of bistable circuits of even-numbered stages) are included in a gate driver 400. Note that in the case of the configuration shown in FIG. 11, for the shift register 411 a first gate clock signal CK1 or a second gate clock signal CK1B is provided to the bistable circuits as a first clock CKA, and for the shift register 412 a third gate clock signal CK2 or a fourth gate clock signal CK2B is provided to the bistable circuits as a first clock CKA. Note also that in the case of the configuration shown in FIG. 11, a gate start pulse signal GSP_O for the shift register 411 and a gate start pulse signal GSP_E for the shift resister 412 are used as a gate start pulse signal, and a gate end pulse signal GEP_O for the shift register 411 and a gate end pulse signal GEP_E for the shift resister 412 are used as a gate end pulse signal.

Furthermore, although in the first embodiment the gate driver 400 is provided only on one edge side, in a direction in which the gate bus lines are arranged, of the display unit 600, the present invention is not limited thereto and the configuration may be such that gate drivers are provided on both edge sides of the display unit 600. In particular, when a panel with a large load capacitance such as a large panel is adopted, by providing gate drivers on both edge sides of the display unit 600, insufficient charging of pixel capacitances can be suppressed.

Furthermore, a specific configuration of a bistable circuit is not limited to that shown in FIG. 8. For example, the configuration may be such that a capacitor is provided between the input terminal that receives a third clock CKC and the second node N2, instead of the thin film transistor MF. In addition, for example, in order to suppress a leakage of a current at the first node N1, the thin film transistors ME and ML may have a multi-gate configuration or the thin film transistors ME, ML, and MB may have a multi-gate configuration.

<2. Second Embodiment>

<2.1 Overall Configuration, etc.>

Figure 12:
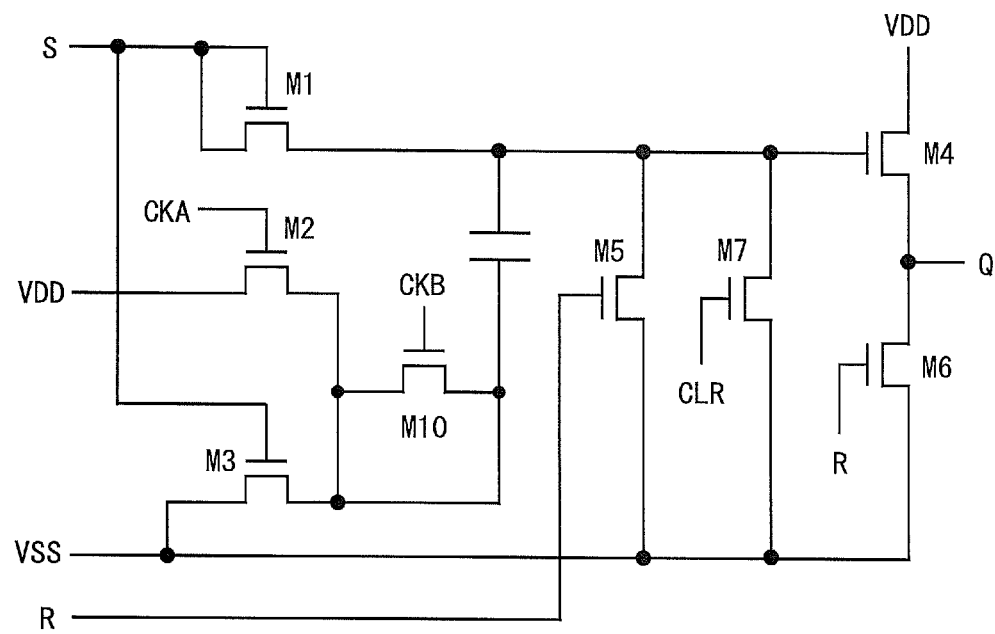
FIG. 12 is a circuit diagram showing an exemplary configuration of one stage (bistable circuit) of a shift register in an active matrix-type liquid crystal display device according to a second embodiment of the present invention.

Next, a second embodiment of the present invention will be described. An overall configuration and a configuration of a gate driver are the same as those of the first embodiment and thus description thereof is omitted (see FIGS. 2 to 5). Note, however, that unlike the first embodiment, not only a low-level direct-current power supply potential VSS but also a high-level direct-current power supply potential VDD is provided to each bistable circuit. In each bistable circuit, the high-level direct-current power supply potential VDD is provided, for example, to the drain terminals of thin film transistors. As such, in the present embodiment, two types of direct-current power supply potentials are provided to the bistable circuits composing a shift register 410. FIG. 12 is a circuit diagram showing an exemplary configuration of a bistable circuit that operates using two types of direct-current power supply potentials.

<2.2 Layout>

Figure 13:
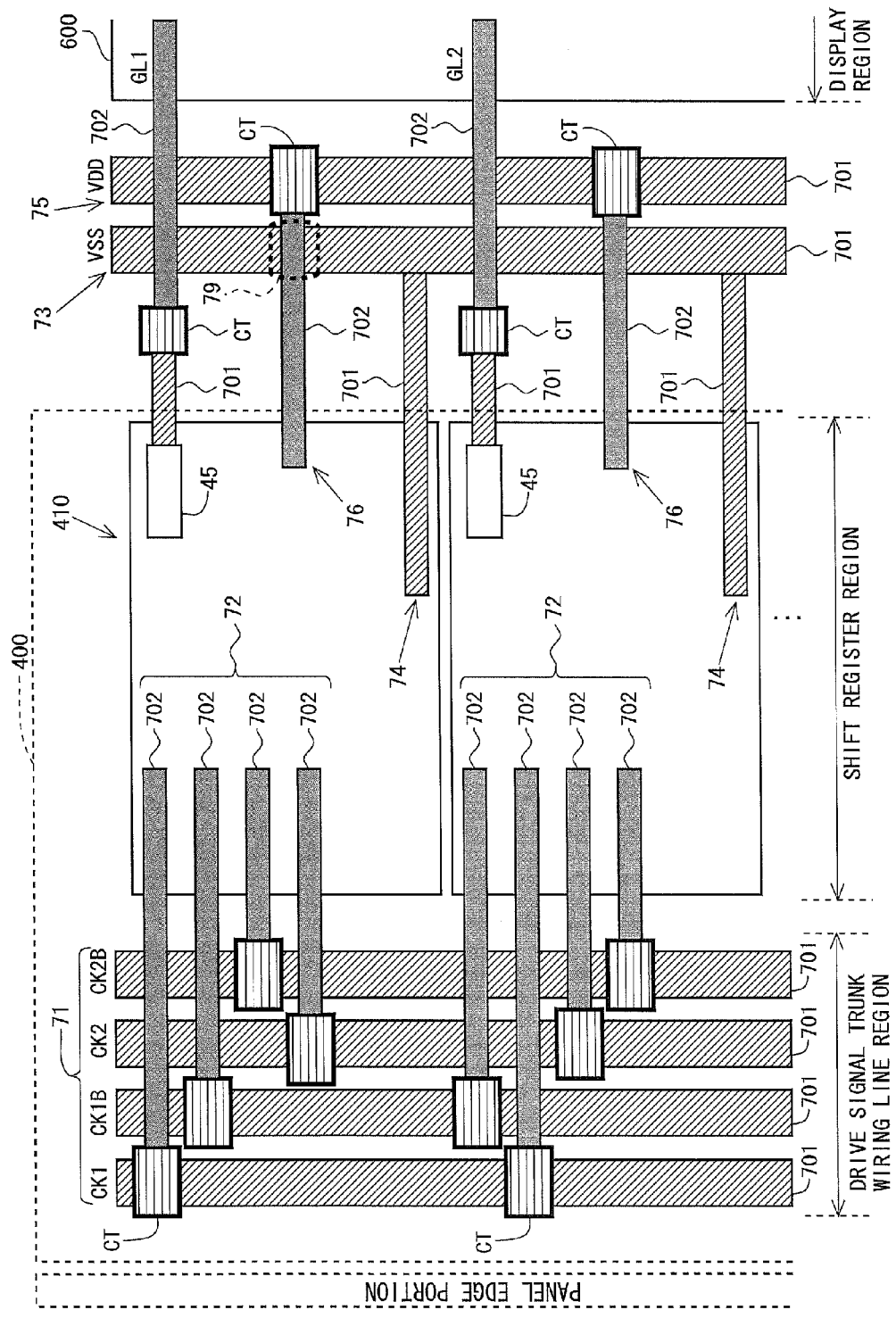
FIG. 13 is a layout diagram of a gate driver and an area in the vicinity thereof in the second embodiment.

FIG. 13 is a layout diagram of a gate driver 400 and an area in the vicinity thereof in the present embodiment. In the first embodiment, as a trunk wiring line for transmitting a direct-current power supply potential to be provided to bistable circuits, a VSS trunk wiring line 73 that transmits a low-level direct-current power supply potential VSS is formed on a substrate. On the other hand, in the present embodiment, as shown in FIG. 13, in addition to a VSS trunk wiring line 73 that transmits a low-level direct-current power supply potential VSS, a VDD trunk wiring line 75 that transmits a high-level direct-current power supply potential VDD is formed on a substrate. Both the VSS trunk wiring line 73 and the VDD trunk wiring line 75 are formed in a region between a shift register region and a display region. As for a positional relationship between the VSS trunk wiring line 73 and the VDD trunk wiring line 75, in the present embodiment, the region where the VSS trunk wiring line 73 is formed is closer to the shift register region than the region where the VDD trunk wiring line 75 is formed.

As with the first embodiment, drive signal trunk wiring lines 71 are all formed from a source metal 701, and each bistable circuit and the drive signal trunk wiring lines 71 are connected to each other by drive signal branch wiring lines 72 formed from a gate metal 702. Note that a drive signal trunk wiring line 71 and a drive signal branch wiring line 72 are connected to each other through a contact CT.

The VSS trunk wiring line 73 and the VDD trunk wiring line 75 are both formed from a source metal 701. Each bistable circuit and the VSS trunk wiring line 73 are connected to each other by a VSS branch wiring line 74 formed from a source metal 701. Each bistable circuit and the VDD trunk wiring line 75 are connected to each other by a VDD branch wiring line 76 formed from a gate metal 702. The VDD trunk wiring line 75 and the VDD branch wiring line 76 are connected to each other through a contact CT.

Note that in the present embodiment a first direct-current power supply potential trunk wiring line is implemented by the VSS trunk wiring line 73, a second direct-current power supply potential trunk wiring line is implemented by the VDD trunk wiring line 75, a first direct-current power supply potential branch wiring line is implemented by the VSS branch wiring line 74, and a second direct-current power supply potential branch wiring line is implemented by the VDD branch wiring line 76.

<2.3 Advantageous Effects>

According to the present embodiment, in a liquid crystal display device including a monolithic gate driver having the shift register 410 to which two types of direct-current power supply potentials are to be provided, there is no overlapping portion between a direct-current power supply potential branch wiring line 74 or 76 and the drive signal trunk wiring lines 71. Hence, as with the first embodiment, the width of the direct-current power supply potential trunk wiring lines 73 and 75 and the width of the drive signal trunk wiring lines 71 can be made narrower than those of the conventional configuration. In addition, since a load capacitance is reduced over the conventional configuration, a reduction in power consumption can be achieved. Furthermore, since, as described above, the width of the direct-current power supply potential trunk wiring lines 73 and 75 and the width of the drive signal trunk wiring lines 71 can be made narrower than those of the conventional configuration, the picture-frame of the panel can be narrowed.

Meanwhile, in the present embodiment, there is an overlapping portion between the VSS trunk wiring line 73 and a VDD branch wiring line 76, like a portion indicated by reference character 79 in FIG. 13. Hence, a load capacitance resulting from the overlapping portion occurs. However, unlike the conventional configuration shown in FIG. 21, two wiring lines which are present at the overlapping portion are both wiring lines for transmitting a direct-current power supply potential, i.e., a constant potential. Hence, a change in direct-current power supply potentials (VSS potential and VDD potential) resulting from capacitance coupling does not occur.

As described above, in the liquid crystal display device including the monolithic gate driver having the shift register 410 to which two types of direct-current power supply potentials are to be provided, without degrading display quality, miniaturization can be achieved while reducing power consumption.

<2.4 Variants>

Variants of the second embodiment will be described below. Note that in the above-described second embodiment and the following variants the position of a VSS trunk wiring line 73 and the position of a VDD trunk wiring line 75 may be reversed.

<2.4.1 First Variant>

Figure 14:
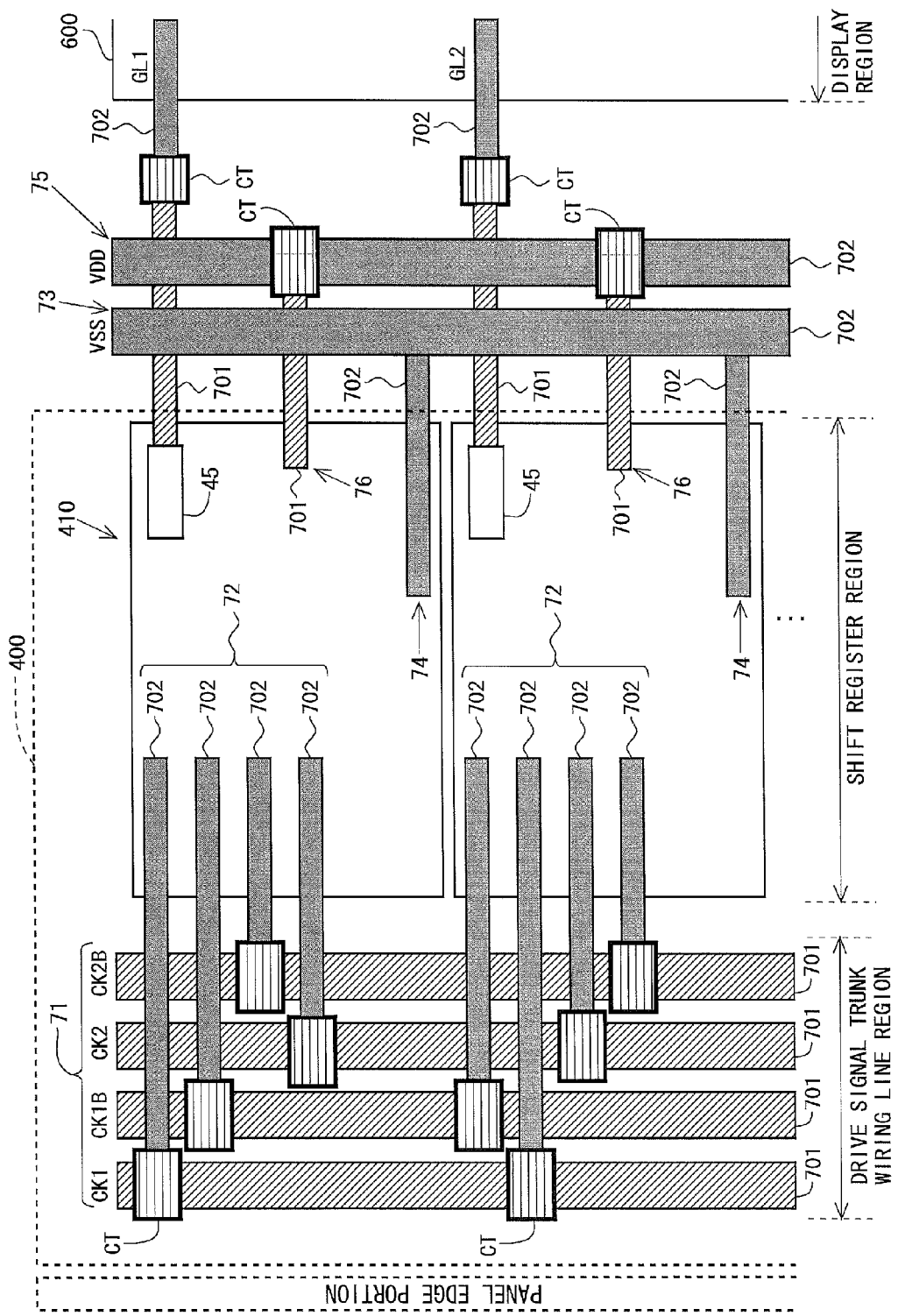
FIG. 14 is a layout diagram of a gate driver and an area in the vicinity thereof in a first variant of the second embodiment.

FIG. 14 is a layout diagram of a gate driver 400 and an area in the vicinity thereof in a first variant of the second embodiment. In the present variant, unlike the second embodiment, a VSS trunk wiring line 73 and a VDD trunk wiring line 75 are both formed from a gate metal 702. Each bistable circuit and the VSS trunk wiring line 73 are connected to each other by a VSS branch wiring line 74 formed from a gate metal 702. Each bistable circuit and the VDD trunk wiring line 75 are connected to each other by a VDD branch wiring line 76 formed from a source metal 701. Note that the VDD trunk wiring line 75 and the VDD branch wiring line 76 are connected to each other through a contact CT.

<2.4.2 Second Variant>

Figure 15:
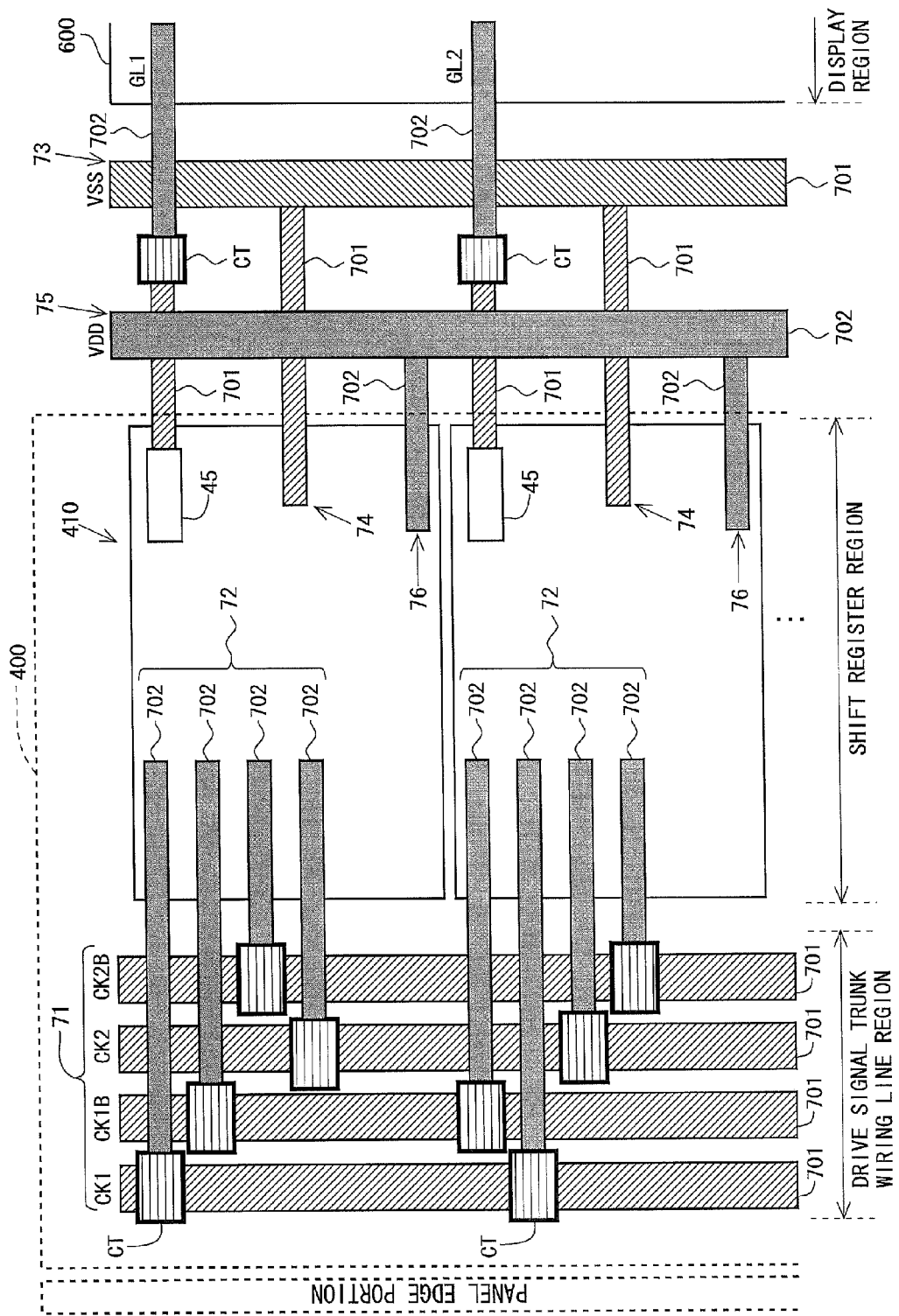
FIG. 15 is a layout diagram of a gate driver and an area in the vicinity thereof in a second variant of the second embodiment.

FIG. 15 is a layout diagram of a gate driver 400 and an area in the vicinity thereof in a second variant of the second embodiment. In the present variant, a VDD trunk wiring line 75 is formed in a region between contacts CTs provided to gate bus lines and a shift register region, and a VSS trunk wiring line 73 is formed in a region between the contacts CTs provided to the gate bus lines and a display region. The VDD trunk wiring line 75 is formed from a gate metal 702 and the VSS trunk wiring line 73 is formed from a source metal 701. Each bistable circuit and the VDD trunk wiring line 75 are connected to each other by a VDD branch wiring line 76 formed from a gate metal 702. Each bistable circuit and the VSS trunk wiring line 73 are connected to each other by a VSS branch wiring line 74 formed from a source metal 701.

<2.4.3 Third Variant>

Figure 16:
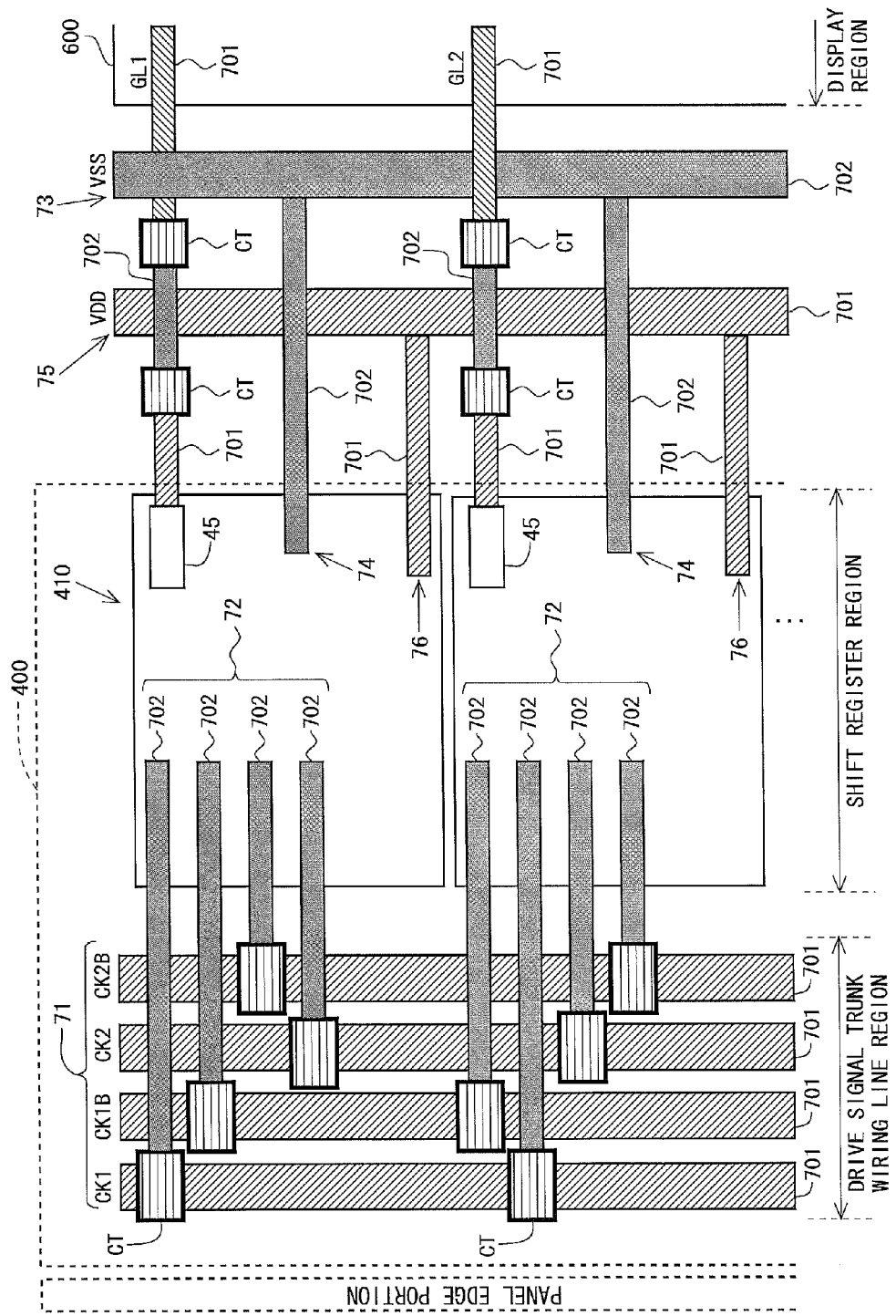
FIG. 16 is a layout diagram of a gate driver and an area in the vicinity thereof in a third variant of the second embodiment.

FIG. 16 is a layout diagram of a gate driver 400 and an area in the vicinity thereof in a third variant of the second embodiment. In the present variant, a VDD trunk wiring line 75 is formed from a source metal 701 and a VSS trunk wiring line 73 is formed from a gate metal 702. Taking a look at a positional relationship between the VSS trunk wiring line 73 and the VDD trunk wiring line 75, the region where the VDD trunk wiring line 75 is formed is closer to a shift register region of the panel than the region where the VSS trunk wiring line 73 is formed. Each bistable circuit and the VDD trunk wiring line 75 are connected to each other by a VDD branch wiring line 76 formed from a source metal 701. Each bistable circuit and the VSS trunk wiring line 73 are connected to each other by a VSS branch wiring line 74 formed from a gate metal 702. As shown in FIG. 16, a gate bus line is configured by a wiring line pattern (hereinafter, referred to as a gate metal portion) formed from a gate metal 702 so as to form an overlapping portion with the VDD trunk wiring line 75, a wiring line pattern connected to an output transistor 45 and connected to one end of the gate metal portion through a contact CT and formed from a source metal 701, and a wiring line pattern connected to the other end of the gate metal portion through a contact CT and formed from a source metal 701 so as to form an overlapping portion with the VSS trunk wiring line 73.

<2.4.4 Fourth Variant>

Figure 17:
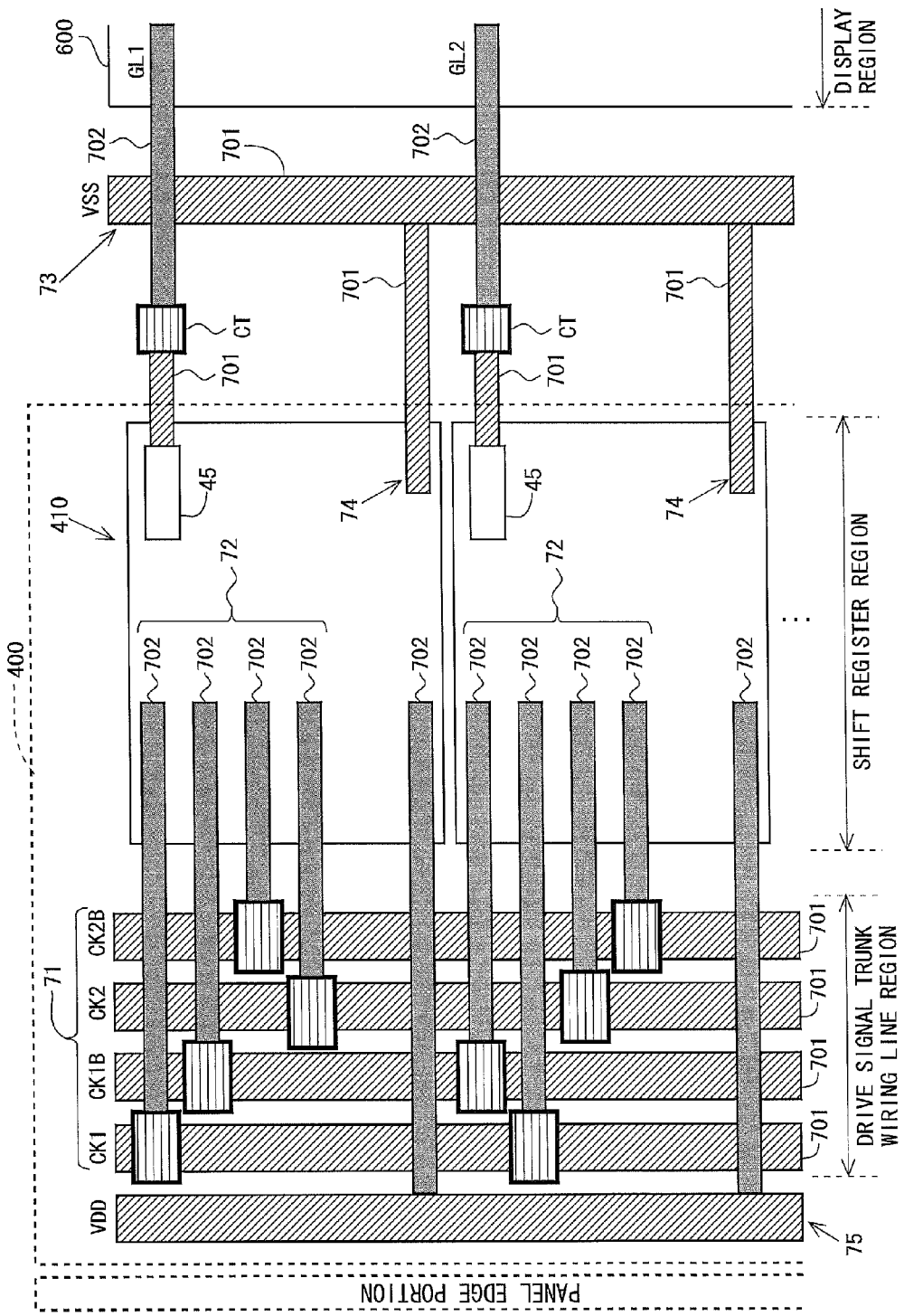
FIG. 17 is a layout diagram of a gate driver and an area in the vicinity thereof in a fourth variant of the second embodiment.

FIG. 17 is a layout diagram of a gate driver 400 and an area in the vicinity thereof in a fourth variant of the second embodiment. In the present variant, of trunk wiring lines (a VSS trunk wiring line 73 and a VDD trunk wiring line 75) that transmit direct-current power supply potentials, only the VSS trunk wiring line 73 is formed in a region between a shift register region and a display region. The VDD trunk wiring line 75 is formed in a region between a drive signal trunk wiring line region and a panel edge portion.

<2.4.5 Advantageous Effects of the Variants>

In the first to fourth variants, too, as with the second embodiment, in a liquid crystal display device including a monolithic gate driver having a shift register 410 to which two types of direct-current power supply potentials are to be provided, without degrading display quality, miniaturization can be achieved while reducing power consumption.

In the second and third variants, for both of a VSS wiring line and a VDD wiring line, a trunk wiring line and its branch wiring line are formed from the same metal film, and thus, there is no need of a contact CT for connecting the trunk wiring line to the branch wiring line, inhibiting an increase in resistance resulting from the wiring line width becoming narrow at a contact portion.

<3. Third Embodiment>
<3.1 Layout>

Next, a third embodiment of the present invention will be described. An overall configuration and a configuration of a gate driver are the same as those of the first embodiment and thus description thereof is omitted (see FIGS. 2 to 5).

Figure 18:
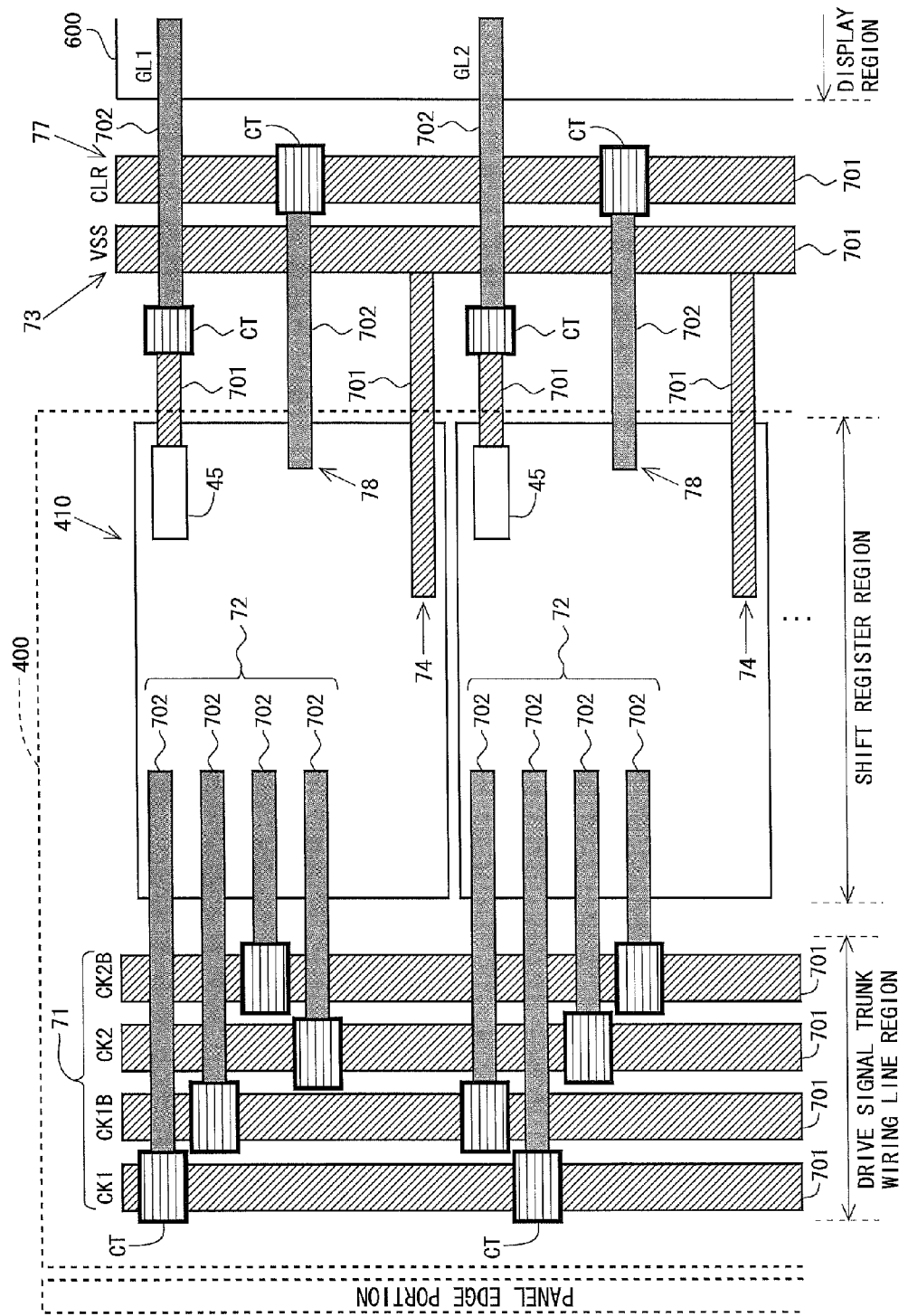
FIG. 18 is a layout diagram of a gate driver and an area in the vicinity thereof in an active matrix-type liquid crystal display device according to a third embodiment of the present invention.

FIG. 18 is a layout diagram of a gate driver 400 and an area in the vicinity thereof in the present embodiment. In the first embodiment, in a region between a shift register region and a display region, only a VSS trunk wiring line 73 that transmits a low-level direct-current power supply potential VSS is formed on a substrate. On the other hand, in the present embodiment, as shown in FIG. 18, in a region between a shift register region and a display region, in addition to a VSS trunk wiring line 73 that transmits a low-level direct-current power supply potential VSS, a clear signal trunk wiring line 77 that transmits a clear signal CLR for initializing the state of each bistable circuit is formed on a substrate. As for a positional relationship between the VSS trunk wiring line 73 and the clear signal trunk wiring line 77, in the present embodiment, the region where the VSS trunk wiring line 73 is formed is closer to the shift register region than the region where the clear signal trunk wiring line 77 is formed.

As with the first embodiment, drive signal trunk wiring lines 71 are all formed from a source metal 701, and each bistable circuit and the drive signal trunk wiring lines 71 are connected to each other by drive signal branch wiring lines 72 formed from a gate metal 702. Note that a drive signal trunk wiring line 71 and a drive signal branch wiring line 72 are connected to each other through a contact CT.

The VSS trunk wiring line 73 and the clear signal trunk wiring line 77 are both formed from a source metal 701. Each bistable circuit and the VSS trunk wiring line 73 are connected to each other by a VSS branch wiring line 74 formed from a source metal 701. Each bistable circuit and the clear signal trunk wiring line 77 are connected to each other by a clear signal branch wiring line 78 formed from a gate metal 702. The clear signal trunk wiring line 77 and the clear signal branch wiring line 78 are connected to each other through a contact CT.

A gate bus line is configured by a wiring line pattern extending from an output transistor 45 to the display region side and formed from a source metal 701, a wiring line pattern extending from within the display region to the shift register region side and formed from a gate metal 702, and a contact CT that connects the wiring line pattern formed from the source metal 701 to the wiring line pattern formed from the gate metal 702.

Note that the position of the VSS trunk wiring line 73 and the position of the clear signal trunk wiring line 77 may be reversed. Note, however, that it is preferred that the VSS trunk wiring line 73 be configured not to have contacts CTs. The reason for it is that if the configuration is such that the VSS trunk wiring line 73 and a VSS branch wiring line 74 are connected to each other by a contact CT, then the width of the trunk wiring line becomes substantially narrow at the contact CT portion, increasing wiring line resistance.

Note also that although, in a region between the shift register region and the display region, the clear signal trunk wiring line 77 is formed in addition to the VSS trunk wiring line 73, the present invention is not limited thereto. The configuration may be such that, instead of the clear signal trunk wiring line 77, a trunk wiring line that transmits, among signals for driving a shift register 410, a signal with a small on-duty, typically, one that generates a pulse only once during one frame period, is formed in a region between the shift register region and the display region. Alternatively, the configuration may be such that, in addition to the VSS trunk wiring line 73, a plurality of trunk wiring lines that transmit signals with a small on-duty are formed in a region between the shift register region and the display region.

<3.2 Advantageous Effects>

According to the present embodiment, as with the first embodiment, in a liquid crystal display device including a monolithic gate driver, without degrading display quality, miniaturization can be achieved while reducing power consumption.

Meanwhile, in the present embodiment, there is an overlapping portion between the VSS trunk wiring line 73 and a clear signal branch wiring line 78. Hence, a load capacitance resulting from the overlapping portion occurs. However, since the on-duty of a clear signal CLR which is transmitted through the clear signal branch wiring line 78 is very small (the signal goes to a high level only once during one frame period), degradation in display quality due to a change in direct-current power supply potential resulting from capacitance coupling does not occur.

<3.3 Variants>

Variants of the third embodiment will be described below.

<3.3.1 First Variant>

Figure 19:
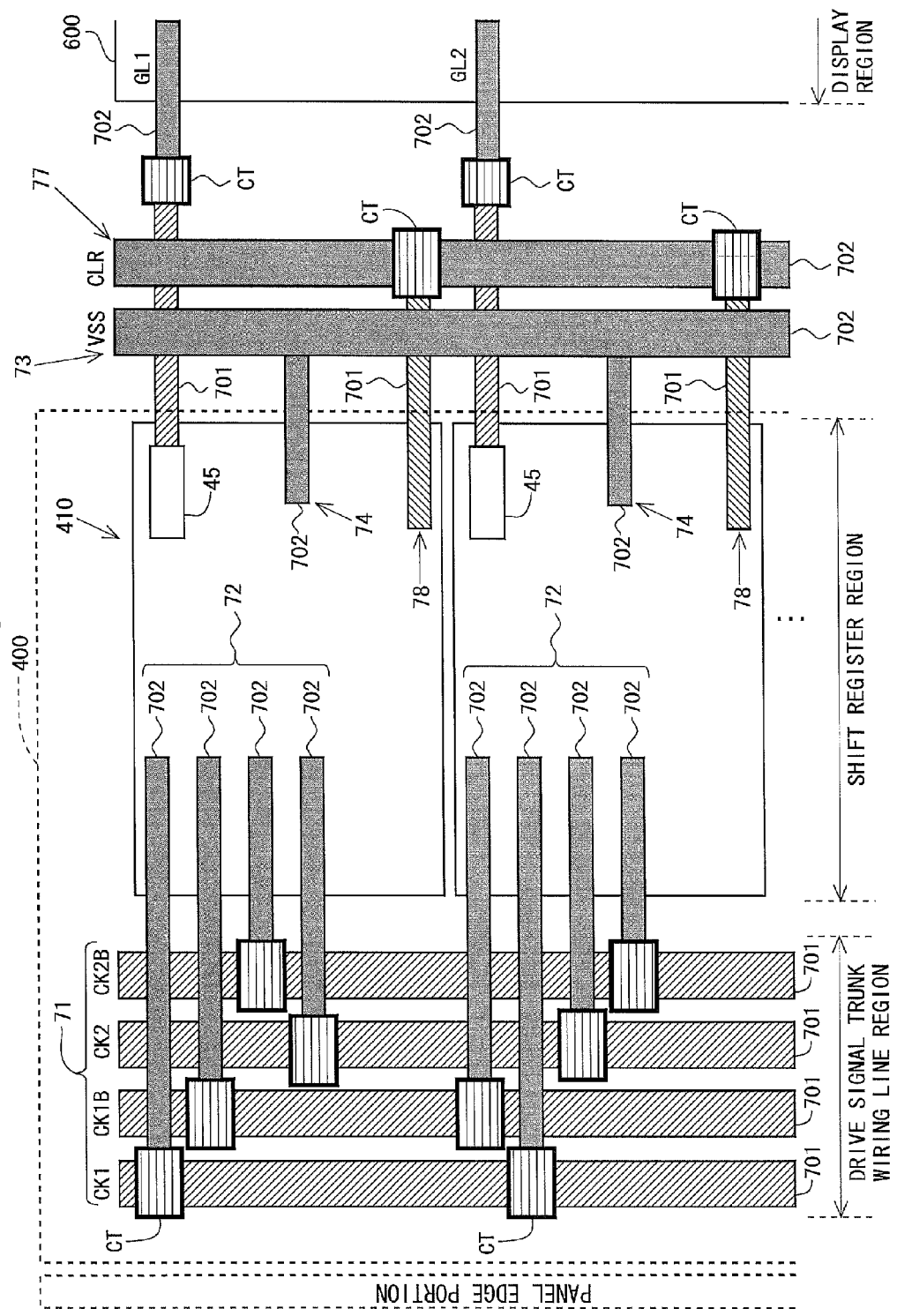
FIG. 19 is a layout diagram of a gate driver and an area in the vicinity thereof in a first variant of the third embodiment.

FIG. 19 is a layout diagram of a gate driver 400 and an area in the vicinity thereof in a first variant of the third embodiment. In the present variant, unlike the third embodiment, a VSS trunk wiring line 73 and a clear signal trunk wiring line 77 are both formed from a gate metal 702. Each bistable circuit and the VSS trunk wiring line 73 are connected to each other by a VSS branch wiring line 74 formed from a gate metal 702. Each bistable circuit and the clear signal trunk wiring line 77 are connected to each other by a clear signal branch wiring line 78 formed from a source metal 701. The clear signal trunk wiring line 77 and the clear signal branch wiring line 78 are connected to each other through a contact CT. Since the VSS trunk wiring line 73 and the clear signal trunk wiring line 77 are formed from the gate metal 702, contacts CTs provided to gate bus lines are, unlike the third embodiment, arranged closer to the display region side than the VSS trunk wiring line 73 and the clear signal trunk wiring line 77.

<3.3.2 Second Variant>

FIG. 20 is a layout diagram of a gate driver 400 and an area in the vicinity thereof in a second variant of the third embodiment. In the present variant, a clear signal trunk wiring line 77 is formed in a region between contacts CTs provided to gate bus lines and a shift register region, and a VSS trunk wiring line 73 is formed in a region between the contacts CTs provided to the gate bus lines and a display region. The clear signal trunk wiring line 77 is formed from a gate metal 702 and the VSS trunk wiring line 73 is formed from a source metal 701. Each bistable circuit and the clear signal trunk wiring line 77 is connected to each other by a clear signal branch wiring line 78 formed from a gate metal 702. Each bistable circuit and the VSS trunk wiring line 73 are connected to each other by a VSS branch wiring line 74 formed from a source metal 701.

<3.3.3 Advantageous Effects of the Variants>

In the first and second variants, too, as with the third embodiment, in a liquid crystal display device including a monolithic gate driver, without degrading display quality, miniaturization can be achieved while reducing power consumption.

<4. Others>

Although in the above-described embodiments description is made using a liquid crystal display device as an example, the present invention is not limited thereto. The present invention can also be applied to other display devices such as an organic EL (Electro Luminescence).

Description Of Reference Characters

- 7: ARRAY SUBSTRATE
- 71: DRIVE SIGNAL TRUNK WIRING LINE
- 72: DRIVE SIGNAL BRANCH WIRING LINE
- 73: VSS TRUNK WIRING LINE
- 74: VSS BRANCH WIRING LINE
- 75: VDD TRUNK WIRING LINE
- 76: VDD BRANCH WIRING LINE
- 400: GATE DRIVER (SCANNING SIGNAL LINE DRIVE CIRCUIT)
- 410: SHIFT REGISTER
- 600: DISPLAY UNIT
- 701: SOURCE METAL
- 702: GATE METAL
- CK1: FIRST GATE CLOCK SIGNAL
- CK1B: SECOND GATE CLOCK SIGNAL
- CK2: THIRD GATE CLOCK SIGNAL
- CK2B: FOURTH GATE CLOCK SIGNAL
- CLR: CLEAR SIGNAL
- CT: CONTACT
- GL: GATE BUS LINE
- VDD: HIGH-LEVEL DIRECT-CURRENT POWER SUPPLY POTENTIAL
- VSS: LOW-LEVEL DIRECT-CURRENT POWER SUPPLY POTENTIAL

The invention claimed is:

1. A display device comprising:
    a substrate;
    a pixel circuit formed in a display region for displaying an image, the display region being a part of an entire region on the substrate;
    a plurality of scanning signal lines formed in the display region and forming a part of the pixel circuit;
    a shift register that is formed in a part of the entire region on the substrate other than the display region and that includes a plurality of bistable circuits having a first state and a second state and that sequentially drives the plurality of scanning signal lines by the plurality of bistable circuits sequentially placed in the first state based on a plurality of clock signals, the plurality of bistable circuits being connected in series with each other and provided so as to have a one-to-one correspondence with the plurality of scanning signal lines;
    drive signal trunk wiring lines formed in a region on an opposite side of the display region with respect to a shift register region, and transmitting shift register drive signals including the plurality of clock signals, the shift register region being a region where the shift register is formed, and the shift register drive signals being signals for controlling operation of the plurality of bistable circuits;
    drive signal branch wiring lines that connect the drive signal trunk wiring lines to each bistable circuit;
    a direct-current power supply potential trunk wiring line that transmits a direct-current power supply potential to be provided to the plurality of bistable circuits; and
    a direct-current power supply potential branch wiring line that connects the direct-current power supply potential trunk wiring line to each bistable circuit, wherein
    the direct-current power supply potential trunk wiring line is formed in a region between the shift register region and the display region.

2. The display device according to claim 1, wherein the substrate has a layered structure including a first metal film and a second metal film, the first metal film forming wiring line patterns including source electrodes of thin film transistors provided in the plurality of bistable circuits, and
    the second metal film forming wiring line patterns including gate electrodes of the thin film transistors, and the direct-current power supply potential trunk wiring line and the direct-current power supply potential branch wiring line are formed from a same metal film, the same metal film being one of the first metal film and the second metal film.

3. The display device according to claim 2, wherein the direct-current power supply potential trunk wiring line includes a first direct-current power supply potential trunk wiring line that transmits a low-level direct-current power supply potential to be provided to the plurality of bistable circuits.

4. The display device according to claim 3, wherein the first direct-current power supply potential trunk wiring line is formed from the first metal film.

5. The display device according to claim 3, wherein the direct-current power supply potential trunk wiring line further includes a second direct-current power supply potential trunk wiring line that transmits a high-level direct-5 current power supply potential to be provided to the plurality of bistable circuits.

6. The display device according to claim 5, wherein
    the direct-current power supply potential branch wiring line further includes: a first direct-current power supply potential branch wiring line that connects the first direct-current power supply potential trunk wiring line to each bistable circuit; and a second direct-current power supply potential branch wiring line that connects the second direct-current power supply potential trunk wiring line to each bistable circuit,
    the first direct-current power supply potential trunk wiring line and the first direct-current power supply potential branch wiring line are formed from a same metal film which is one of the first metal film and the second metal film,
    the second direct-current power supply potential trunk wiring line and the second direct-current power supply potential branch wiring line are formed from a same metal film which is one of the first metal film and the second metal film, and
    the first direct-current power supply potential trunk wiring line and the second direct-current power supply potential trunk wiring line are formed from different metal films.

7. The display device according to claim 2, wherein the drive signal trunk wiring lines are formed from the first metal film.

8. The display device according to claim 1, wherein wiring lines that form the direct-current power supply potential trunk wiring line and the drive signal trunk wiring lines are all equal in wiring line width to one another.

9. The display device according to claim 1, wherein a trunk wiring line for transmitting a signal which is one of the shift register drive signals other than the plurality of clock signals and generates five pulses or less during one frame period is formed in a region between the shift register region and the display region.

* * * * *